(12) United States Patent
Irwin et al.

(10) Patent No.: US 11,659,723 B2
(45) Date of Patent: May 23, 2023

(54) PEROVSKITE MATERIAL PHOTOVOLTAIC DEVICE AND METHOD FOR ASSEMBLY

(71) Applicant: CUBICPV INC., Dallas, TX (US)

(72) Inventors: Michael Irwin, Heath, TX (US); Michael Holland, Lancaster, TX (US)

(73) Assignee: CubicPV Inc., Dallas, TX (US)

( * ) Notice: Subject to any disclaimer, the term of this patent is extended or adjusted under 35 U.S.C. 154(b) by 0 days.

(21) Appl. No.: 16/682,254

(22) Filed: Nov. 13, 2019

(65) Prior Publication Data
US 2021/0143350 A1 May 13, 2021

(51) Int. Cl.
*H01L 51/42* (2006.01)
*H01L 51/00* (2006.01)

(52) U.S. Cl.
CPC ...... *H01L 51/4213* (2013.01); *H01L 51/0077* (2013.01)

(58) Field of Classification Search
CPC ............. H01L 51/0077; H01L 51/4213; H01L 31/1884; H01L 51/0024; H01L 27/302; H01L 31/0687; H01L 31/0725; H01L 31/18
See application file for complete search history.

(56) References Cited

U.S. PATENT DOCUMENTS

| | | | | |
|---|---|---|---|---|
| 2009/0114272 A1* | 5/2009 | Inoue | ................. | C09K 3/10 136/252 |
| 2015/0318477 A1* | 11/2015 | Irwin | ................. | H01L 31/032 556/35 |
| 2015/0325382 A1* | 11/2015 | Suzuka | ................. | H01G 9/2077 136/251 |
| 2018/0122584 A1* | 5/2018 | Kim | ................. | H01L 51/0035 |
| 2018/0299764 A1 | 10/2018 | Irwin et al. | | |
| 2019/0006547 A1 | 1/2019 | Watts et al. | | |

(Continued)

FOREIGN PATENT DOCUMENTS

| | | |
|---|---|---|
| WO | 2015/079380 A1 | 6/2015 |
| WO | 2017/200732 A1 | 11/2017 |
| WO | 2019/197478 A1 | 10/2019 |

OTHER PUBLICATIONS

Amani H. Alfaifi,Sean P. Dunfield,Ariel E. Hasse,Bryon W. Larson,Matthew O. Reese,Joe Berry,Maikel van Hest,Najm Alhosiny, Davor Balzar,Sean E. Shaheen, "Investigating the effect of lamination on FAMACs: toward a new phase space of perovskite solar cell fabrication," Proc. SPIE vol. 11094, 1109420. (Year: 2019).*

(Continued)

*Primary Examiner* — Mayla Gonzalez Ramos
(74) *Attorney, Agent, or Firm* — Baker Botts L.L.P.

(57) ABSTRACT

A method for manufacturing a photovoltaic device includes fabricating a first photovoltaic device portion with a first perovskite material layer having a first face, and fabricating a second photovoltaic device portion with a second perovskite material layer having a second face. Then first photovoltaic device portion and the second photovoltaic device portion are arranged such that the first face is in contact with the second face. Finally, the first photovoltaic device portion and second photovoltaic device portion are compressed at a pressure sufficient to fuse the first perovskite material to the second perovskite material.

16 Claims, 18 Drawing Sheets

(56) References Cited

U.S. PATENT DOCUMENTS

2019/0279825 A1* 9/2019 van Hest ............ H01L 51/0026

OTHER PUBLICATIONS

Lai, Wei-Chih, et al. "Perovskite-based solar cells with inorganic inverted hybrid planar heterojunction structure." AIP Advances 8.1 (2018): 015109.
Christians, Jeffrey A., Pierre A. Miranda Herrera, and Prashant V. Kamat. "Transformation of the excited state and photovoltaic efficiency of CH3NH3PbI3 perovskite upon controlled exposure to humidified air." Journal of the American Chemical Society 137.4 (2015): Supporting Information, 7 pages.
Christians, Jeffrey A., Pierre A. Miranda Herrera, and Prashant V. Kamat. "Transformation of the excited state and photovoltaic efficiency of CH3NH3PbI3 perovskite upon controlled exposure to humidified air." Journal of the American Chemical Society 137.4 (2015): 1530-1538.
PCT Notification Concerning Transmittal of the International Preliminary Report on Patentability dated May 27, 2022 and Preliminary Report of Patentability in International Patent Application No. PCT/US2020/058874 dated May 17, 2022.
Transmittal and PCT International Search Report with Written Opinion for International Application No. PCT/US2020/058874, dated Feb. 26, 2021, 11 pages.

\* cited by examiner

Compression To Fuse

PEROVSKITE MATERIAL PHOTOVOLTAIC DEVICE AND METHOD FOR ASSEMBLY

BACKGROUND

Use of photovoltaics (PVs) to generate electrical power from solar energy or radiation may provide many benefits, including, for example, a power source, low or zero emissions, power production independent of the power grid, durable physical structures (no moving parts), stable and reliable systems, modular construction, relatively quick installation, safe manufacture and use, and good public opinion and acceptance of use. Solution processing of thin-film PVs provides an economical method for depositing the various layers which make up PVs. However, the various solution processes needed to deposit each layer may not be compatible with prior deposited layers. Therefore, a method for assembling PV devices is needed to produce PV devices with adjacent layers deposited by incompatible solution chemistry.

The features and advantages of the present disclosure will be readily apparent to those skilled in the art. While numerous changes may be made by those skilled in the art, such changes are within the spirit of the invention.

SUMMARY

A method for manufacturing a photovoltaic device, according to some embodiments, includes the steps of: fabricating a first photovoltaic device portion with a first perovskite material layer having a first face, fabricating a second photovoltaic device portion with a second perovskite material layer having a second face, arranging the first photovoltaic device portion and the second photovoltaic device portion such that the first face is in contact with the second face, and compressing the first photovoltaic device portion and second photovoltaic device portion at a pressure sufficient to fuse the first perovskite material to the second perovskite material.

In particular embodiments, the method includes sealing the photovoltaic device.

In particular embodiments, the method includes placing a glass frit along a perimeter of first photovoltaic device portion prior to compressing the first photovoltaic device portion and second photovoltaic device portion.

In particular embodiments, the first photovoltaic device portion further includes a first substrate, a first electrode layer deposited onto the first substrate, a first interfacial layer deposited between the first electrode layer and the first perovskite material layer. The second photovoltaic device portion further includes a second substrate, a second electrode layer deposited onto the second substrate, a second interfacial layer deposited between the second electrode layer and the second perovskite material layer.

In particular embodiments, the first perovskite material layer and the second perovskite material layer have the same chemical formula and composition.

In particular embodiments, the first perovskite material layer and second perovskite material layer comprise a formamidinium lead iodide perovskite material.

In particular embodiments, the first perovskite material layer comprises a perovskite material having the formula $FAPbI_3$ and the second perovskite material layer comprises a perovskite having the formula $MAPbI_3$.

In particular embodiments, the first perovskite material layer comprises a perovskite material having the formula $CsPbI_3$ and the second perovskite material layer comprises a perovskite having the formula $FAPbI_3$.

In particular embodiments, the first perovskite material layer comprises a perovskite material having the formula $FASnI_3$ and the second perovskite material layer comprises a perovskite having the formula $FAPbI_3$.

In particular embodiments, the pressure sufficient to fuse the first perovskite material to the second perovskite material is between 1 and 7 MPa.

In particular embodiments, the method includes heating the first photovoltaic device portion and second photovoltaic device portion to a temperature between 75° C. and 177° C. while first photovoltaic device portion and second photovoltaic device portion are being compressed.

In particular embodiments, the method includes heating the first photovoltaic device portion and second photovoltaic device portion to a temperature between 75° C. and 177° C. while first photovoltaic device portion and second photovoltaic device portion are being compressed, and wherein the pressure sufficient to fuse the first perovskite material to the second perovskite material is between 1 and 7 MPa.

In particular embodiments, the method includes depositing a glass frit paste, ink, solution, or powder around a perimeter of the first photovoltaic device portion prior to compressing the first photovoltaic device portion and second photovoltaic device portion.

According to some embodiments, a method for manufacturing an electronic device includes depositing a first electrode layer onto a first substrate, depositing one or more first interfacial layers onto the first electrode layer, depositing a first perovskite material layer onto the one or more first interfacial layers, depositing a second electrode layer onto a second substrate, depositing one or more second interfacial layers onto the second electrode layer, depositing a second perovskite material layer onto the one or more second interfacial layers, orienting the second substrate such that the second perovskite material layer is in contact with the first perovskite material layer, and applying a sufficient pressure to the second substrate to fuse the second perovskite material layer with the first perovskite material layer.

In particular embodiments, the first perovskite material layer and the second perovskite material layer have the same chemical formula and composition.

In particular embodiments, the first perovskite material layer and second perovskite material layer comprise a formamidinium lead iodide perovskite material.

In particular embodiments, the first perovskite material layer comprises a perovskite material having the formula $FAPbI_3$ and the second perovskite material layer comprises a perovskite having the formula $MAPbI_3$.

In particular embodiments, the pressure sufficient to fuse the first perovskite material to the second perovskite material is between 1 and 7 MPa.

In particular embodiments, the method includes heating the first photovoltaic device portion and second photovoltaic device portion to a temperature between 75° C. and 177° C. while first photovoltaic device portion and second photovoltaic device portion are being compressed.

In particular embodiments, the method includes heating the first photovoltaic device portion and second photovoltaic device portion to a temperature between 75° C. and 177° C. while first photovoltaic device portion and second photovoltaic device portion are being compressed, and wherein the pressure sufficient to fuse the first perovskite material to the second perovskite material is between 1 and 7 MPa.

In particular embodiments, the method includes depositing a glass frit paste, ink, solution, or powder around a perimeter of the first substrate prior to applying sufficient pressure to the second substrate to fuse the second perovskite material layer with the first perovskite material layer.

According to some embodiments, a photovoltaic device includes a first substrate, a second substrate, a perovskite material layer disposed between the first substrate and the second substrate, a first electrode layer in contact with first substrate and disposed between the first substrate and the perovskite material layer, a second electrode layer in contact with the second substrate and disposed between the second substrate and the perovskite material layer, a first interfacial layer disposed between the first electrode layer and the perovskite material layer, a second interfacial layer disposed between the perovskite material layer and the second electrode layer. There is not an encapsulant layer between the first electrode layer and the first substrate and there is not an encapsulant layer between the second electrode layer and the second substrate.

In particular embodiments, the perovskite material layer comprises a first perovskite material and a second perovskite material fused together.

In particular embodiments, the perovskite material layer comprises formamidinium lead iodide.

In particular embodiments, the first perovskite material comprises methylammonium lead iodide.

In particular embodiments, the first substrate comprises glass and the second substrate comprises glass.

In particular embodiments, the first substrate comprises glass and the second substrate comprises a material that is not glass.

In particular embodiments, the first interfacial layer is an electron transport layer and the second interfacial layer is a hole transport layer.

In particular embodiments, a sealing structure disposed between the first substrate and the second substrate. The sealing structure is fused to the first substrate and second substrate and is arranged such that the perovskite material layer, first electrode layer, second electrode layer, first interfacial layer, second interfacial layer are sealed interior to the first substrate, second substrate, and sealing structure.

In particular embodiments, the sealing structure comprises glass.

Advantages of the present invention may include enabling assembly of thin film PV devices with adjacent layers produced with incompatible solution chemistry. In particular, perovskite layers may be sensitive to many of the solvents used in solution-based methods for deposition of interfacial layers. The present invention provides a method of assembly for PV devices that enables a perovskite material layer to be placed adjacent to an interfacial layer deposited with solution chemistry that would otherwise damage the perovskite material layers. Additionally, in traditional "bottom-up" manufacturing of a thin-film PV device, a sealing or encapsulant layer is required to be deposited on top of the "top" electrode prior to fitment of the "top" substrate/superstrate. The techniques described herein provide a method for constructing two portions of a PV device using bottom up method and then assembling those portions such that an encapsulant layer is not required prior to fitment of the "top" substrate/superstrate.

DETAILED DESCRIPTION OF PREFERRED EMBODIMENTS

Photovoltaic Cells and Other Electronic Devices

Figure 1:
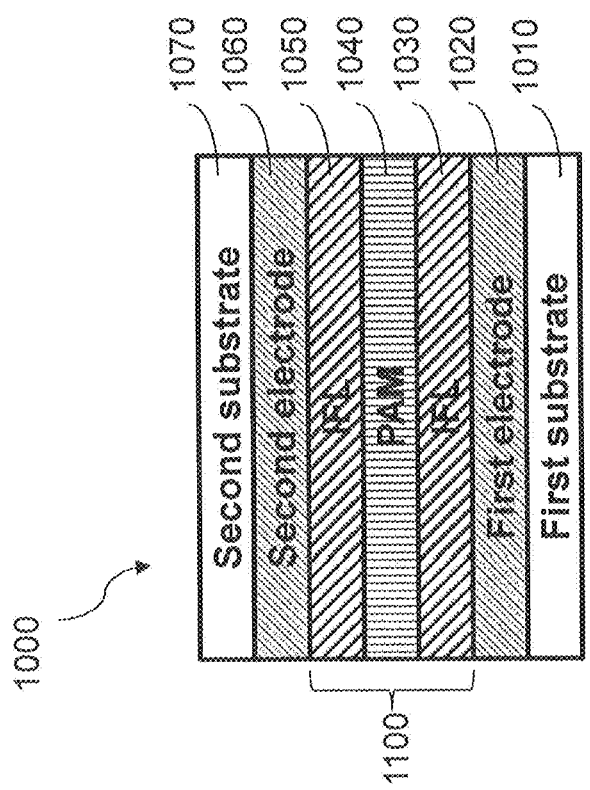
FIG. 1 is a schematic view of a typical photovoltaic cell including an active layer according to some embodiments of the present disclosure.

Some PV embodiments may be described by reference to the illustrative depictions of solar cells as shown in FIG. 1. An example PV architecture according to some embodiments may be substantially of the form substrate-anode-IFL-active layer-IFL-cathode. The active layer of some embodiments may be photoactive, and/or it may include photoactive material. Other layers and materials may be utilized in the cell as is known in the art. Furthermore, it should be noted that the use of the term "active layer" is in no way meant to restrict or otherwise define, explicitly or implicitly, the properties of any other layer—for instance, in some embodiments, either or both IFLs may also be active insofar as they may be semiconducting. In particular, referring to FIG. 1, a stylized generic PV cell 1000 is depicted, illustrating the highly interfacial nature of some layers within the PV. The PV 1000 represents a generic architecture applicable to several PV devices, such as perovskite material PV embodiments. The PV cell 1000 includes a transparent substrate layer 1010, which may be glass (or a material similarly transparent to solar radiation) which allows solar radiation to transmit through the layer. The transparent layer of some embodiments may also be referred to as a superstrate or substrate (e.g., as with substrate layer 3901 of FIG. 2), and it may comprise any one or more of a variety of rigid or flexible materials such as: glass, polyethylene, polypropylene, polycarbonate, polyimide, PMMA, PET, PEN, Kapton, or quartz. In general, the term substrate is used to refer to material upon which the device is deposited during manufacturing. The photoactive layer 1040 may be composed of electron donor or p-type material, and/or an electron acceptor or n-type material, and/or an ambipolar semiconductor, which exhibits both p- and n-type material characteristics, and/or an intrinsic semiconductor which exhibits neither n-type or p-type characteristics. Photoactive layer 1040 may be a perovskite material as described herein, in some embodiments. The active layer or, as depicted in FIG. 1, the photo-active layer 1040, is sandwiched between two electrically conductive electrode layers 1020 and 1060. In FIG. 1, the electrode layer 1020 may be a transparent conductor such as a tin-doped indium oxide (ITO material) or other material as described herein. In other embodiments second substrate 1070 and second electrode 1060 may be transparent. As previously noted, an active layer of some embodiments need not necessarily be photoactive, although in the device shown in FIG. 1, it is. The electrode layer 1060 may be an aluminum material or other metal, or other conductive materials such as carbon. Other materials may be used as is known in the art. The cell 1010 also includes an interfacial layer (IFL) 1030, shown in the example of FIG. 1. The IFL may assist in charge separation. In other embodiments, the IFL 1030 may comprise a multi-layer IFL, which is discussed in greater detail below. There also may be an IFL 1050 adjacent to electrode 1060. In some embodiments, the IFL 1050 adjacent to electrode 1060 may also or instead comprise a multi-layer IFL (again, discussed in greater detail below). An IFL according to some embodiments may be semiconducting in character and may be either intrinsic, ambipolar, p-type, or n-type, or it may be dielectric in character. In some embodiments, the IFL on the cathode side of the device (e.g., IFL 1050 as shown in FIG. 1) may be p-type, and the IFL on the anode side of the device (e.g., IFL 1030 as shown in FIG. 1) may be n-type. In other embodiments, however, the cathode-side IFL may be n-type and the anode-side IFL may be p-type. The cell 1010 may be attached to electrical leads by electrodes 1060 and 1020 and a discharge unit, such as a battery, motor, capacitor, electric grid, or any other electrical load.

Various embodiments of the present disclosure provide improved materials and/or designs in various aspects of solar cell and other devices, including among other things, active materials (including hole-transport and/or electron-transport layers), interfacial layers, and overall device design.

Perovskite Material

Figure 15:
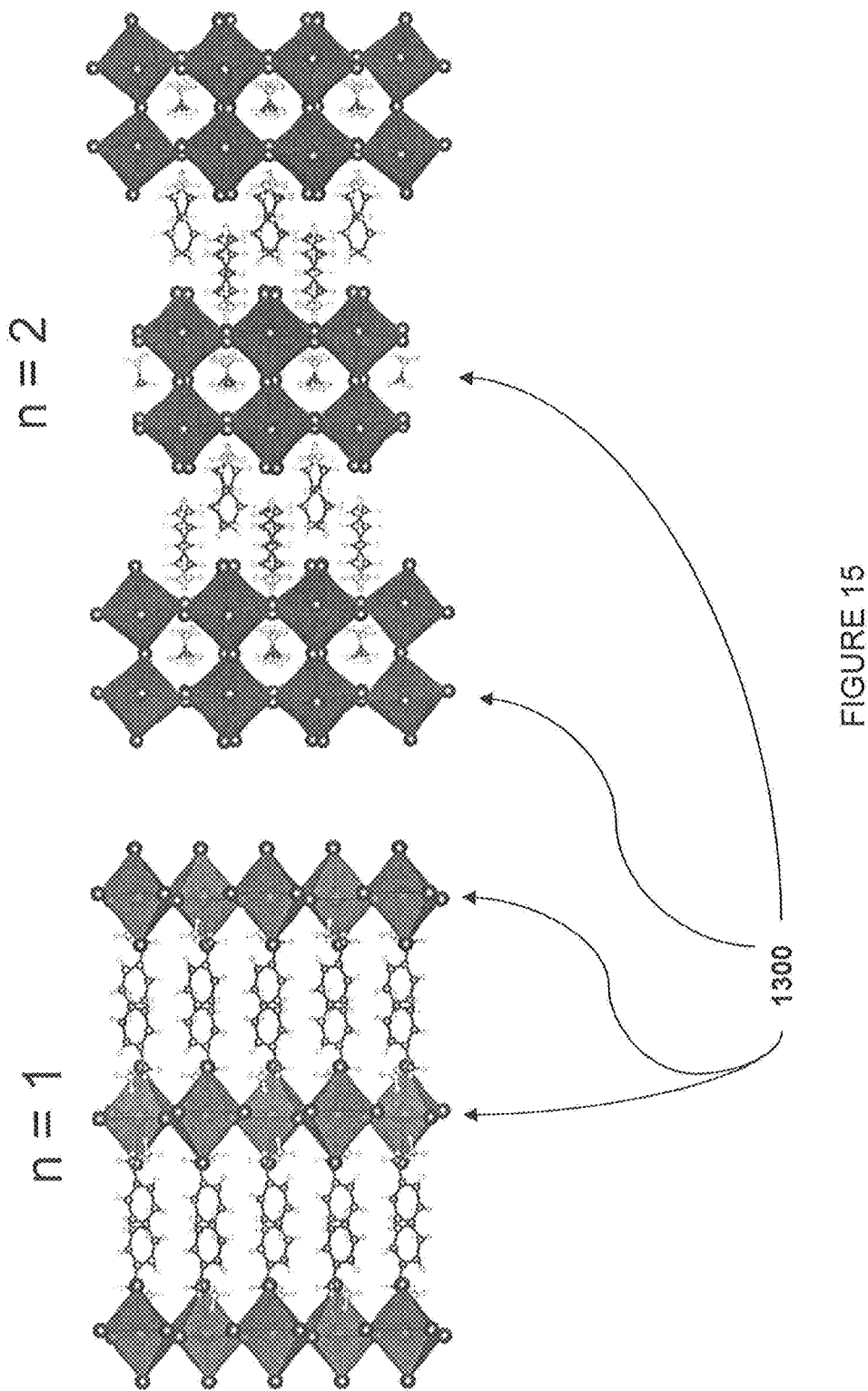
FIG. 15 provides a stylized illustration of thicknesses of inorganic metal halide sublattices of perovskite materials according to some embodiments of the present disclosure.

A perovskite material may be incorporated into one or more aspects of a PV or other device. A perovskite material according to some embodiments may be of the general formula $C_wM_yX_z$, where: C comprises one or more cations (e.g., an amine, ammonium, phosphonium a Group 1 metal, a Group 2 metal, and/or other cations or cation-like compounds); M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); X comprises one or more anions; and w, y, and z represent real numbers between 1 and 20. In some embodiments, C may include one or more organic cations. In some embodiments, each organic cation C may be larger than each metal M, and each anion X may be capable of bonding with both a cation C and a metal M. In particular embodiments, a perovskite material may be of the formula $CMX_3$. In some embodiments, a perovskite material may have the formula $C'_2C_{n-1}M_nX_{3n-1}$, where n is an integer. For example, when n=1 the perovskite material may have the formula $C'_2MX_4$, when n=2 the perovskite material may have the formula $C'_2CM_2X_7$, when n=3 the perovskite material may have the formula $C'_2C_2M_3X_{10}$, when n=4 the perovskite material may have the formula $C'_2C_3M_4X_{13}$, and so on. As illustrated by FIG. 15, the n-value indicates the thickness of an inorganic metal halide sublattice 1300 of the perovskite material.

In certain embodiments, C may include an ammonium, an organic cation of the general formula $[NR_4]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

In certain embodiments, C may include a formamidinium (FA), an organic cation of the general formula $[R_2NCRNR_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., imidazole, benzimidazole, pyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

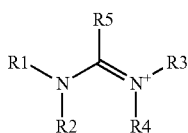

Formula 1

Formula 1 illustrates the structure of a formamidinium cation having the general formula of $[R_2NCRNR_2]^+$ as described above. Formula 2 illustrates examples structures of several formamidinium cations that may serve as a cation "C" in a perovskite material.

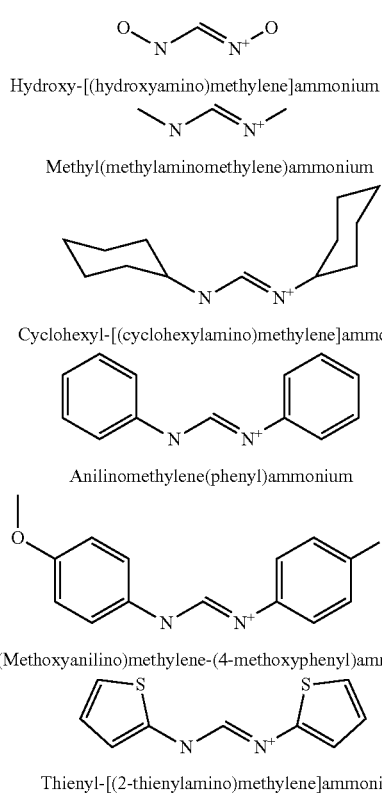

Formula 2

Hydroxy-[(hydroxyamino)methylene]ammonium

Methyl(methylaminomethylene)ammonium

Cyclohexyl-[(cyclohexylamino)methylene]ammonium

Anilinomethylene(phenyl)ammonium (Methoxyanilino)methylene-(4-methoxyphenyl)ammonium Thienyl-[(2-thienylamino)methylene]ammonium In certain embodiments, C may include a guanidinium, an organic cation of the general formula $[(R_2N)_2C=NR_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]-hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

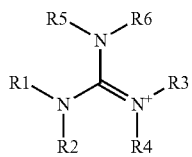

Formula 3

Formula 3 illustrates the structure of a guanidinium cation having the general formula of $[(R_2N)_2C=NR_2]^+$ as described above. Formula 4 illustrates examples of structures of several guanidinium cations that may serve as a cation "C" in a perovskite material.

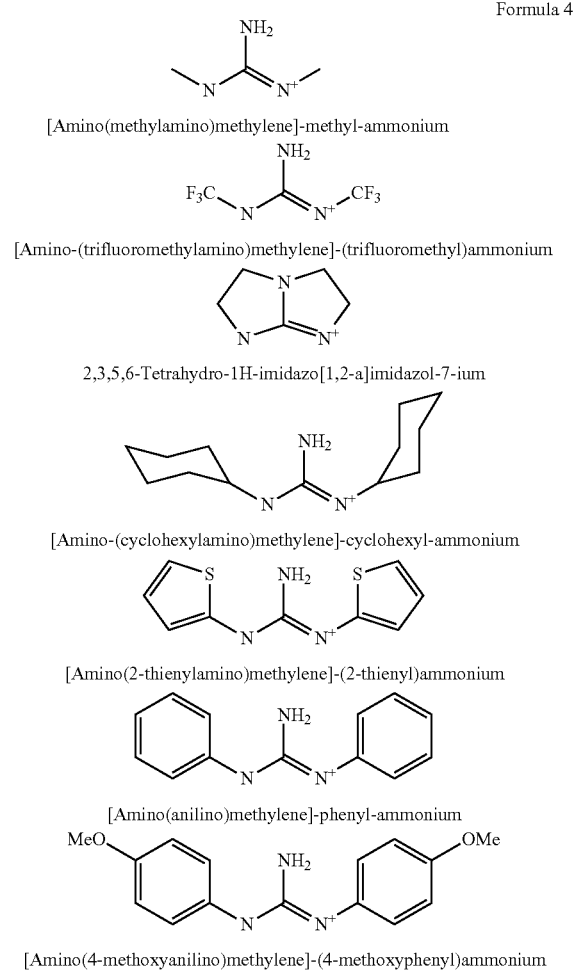

Formula 4

[Amino(methylamino)methylene]-methyl-ammonium

[Amino-(trifluoromethylamino)methylene]-(trifluoromethyl)ammonium 2,3,5,6-Tetrahydro-1H-imidazo[1,2-a]imidazol-7-ium

[Amino-(cyclohexylamino)methylene]-cyclohexyl-ammonium

[Amino(2-thienylamino)methylene]-(2-thienyl)ammonium

[Amino(anilino)methylene]-phenyl-ammonium

[Amino(4-methoxyanilino)methylene]-(4-methoxyphenyl)ammonium

In certain embodiments, C may include an ethene tetramine cation, an organic cation of the general formula $[(R_2N)_2C=C(NR_2)_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

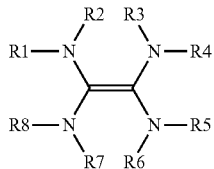

Formula 5

Formula 5 illustrates the structure of an ethene tetramine cation having the general formula of $[(R_2N)_2C=C(NR_2)_2]^+$ as described above. Formula 6 illustrates examples of structures of several ethene tetramine ions that may serve as a cation "C" in a perovskite material.

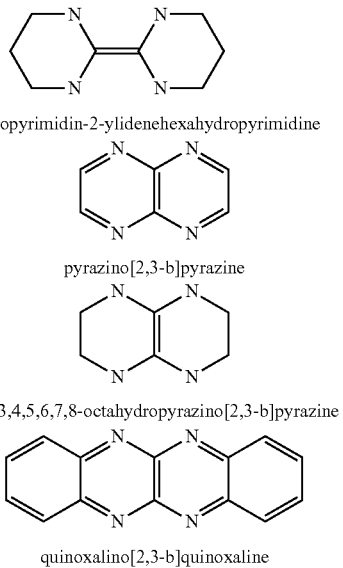

Formula 6

2-hexahydropyrimidin-2-ylidenehexahydropyrimidine pyrazino[2,3-b]pyrazine 1,2,3,4,5,6,7,8-octahydropyrazino[2,3-b]pyrazine quinoxalino[2,3-b]quinoxaline In certain embodiments, C may include an imidazolium cation, an aromatic, cyclic organic cation of the general formula [CRNRCRNRCR]$^+$ where the R groups may be the same or different groups. Suitable R groups may include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

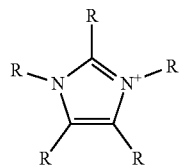

Formula 7

In some embodiments, X may include one or more halides. In certain embodiments, X may instead or in addition include a Group 16 anion. In certain embodiments, the Group 16 anion may be oxide, sulfide, selenide, or telluride. In certain embodiments, X may instead or in addition include one or more a pseudohalides (e.g., cyanide, cyanate, isocyanate, fulminate, thiocyanate, isothiocyanate, azide, triflate, tetrafluoroborate, hexafluorophosphate, tetrakis[3,5-bis (trifluoromethyl) phenyl]borate ("BARF"), tetracarbonylcobaltate, carbamoyldicyanomethanide, dicyanonitrosomethanide, dicyanamide, and tricyanomethanide).

In one embodiment, a perovskite material may comprise the empirical formula $CMX_3$ where: C comprises one or more of the aforementioned cations, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more of the aforementioned anions.

In another embodiment, a perovskite material may comprise the empirical formula $C'M_2X_6$ where: C' comprises a cation with a 2+ charge including one or more of the aforementioned cations, diammonium butane, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more of the aforementioned anions.

In another embodiment, a perovskite material may comprise the empirical formula $C'MX_4$ where: C' comprises a cation with a 2+ charge including one or more of the aforementioned cations, diammonium butane, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more of the aforementioned anions. In such an embodiment, the perovskite material may have a 2D structure.

In one embodiment, a perovskite material may comprise the empirical formula $C_3M_2X_9$ where: C comprises one or more of the aforementioned cations, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more of the aforementioned anions.

In one embodiment, a perovskite material may comprise the empirical formula $CM_2X_7$ where: C comprises one or more of the aforementioned cations, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr n); and X comprises one or more of the aforementioned anions.

In one embodiment, a perovskite material may comprise the empirical formula $C_2MX_4$ where: C comprises one or more of the aforementioned cations, a Group 1 metal, a Group 2 metal, and/or other cations or cation-like compounds; M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more of the aforementioned anions.

Perovskite materials may also comprise mixed ion formulations where C, M, or X comprise two or more species, for example, $Cs_{0.1}FA_{0.9}Pb(I_{0.9}Cl_{0.1})_3$; $Rb_{0.1}FA_{0.9}Pb(I_{0.9}Cl_{0.1})_3Cs_{0.1}FA_{0.9}PbI_3$; $FAPb_{0.5}Sn_{0.5}I_3$; $FA_{0.83}Cs_{0.17}Pb(I_{0.6}Br_{0.4})_3$; $FA_{0.83}Cs_{0.12}Rb_{0.05}Pb(I_{0.6}Br_{0.4})_3$ and $FA_{0.85}MA_{0.15}Pb(I_{0.85}Br_{0.15})_3$.

Interfacial Layers

The present disclosure, in some embodiments, provides advantageous materials and designs of one or more interfacial layers within a PV, including thin-coat IFLs. Thin-coat IFLs may be employed in one or more IFLs of a PV according to various embodiments discussed herein.

According to various embodiments, devices may optionally include an interfacial layer between any two other layers and/or materials, although devices need not contain any interfacial layers. For example, a perovskite material device may contain zero, one, two, three, four, five, or more interfacial layers (such as the example device of FIG. 2, which contains five interfacial layers 3903, 3905, 3907, 3909, and 3911). An interfacial layer may include any suitable material for enhancing charge transport and/or collection between two layers or materials; it may also help prevent or reduce the likelihood of charge recombination once a charge has been transported away from one of the materials adjacent to the interfacial layer. An interfacial layer may additionally physically and electrically homogenize its substrates to create variations in substrate roughness, dielectric constant, adhesion, creation or quenching of defects (e.g., charge traps, surface states). Suitable interfacial materials may include any one or more of: Ag; Al; Au; B; Bi; Ca; Cd; Ce; Co; Cu; Fe; Ga; Ge; H; In; Mg; Mn; Mo; Nb; Ni; Pt; Sb; Sc; Si; Sn; Ta; Ti; V; W; Y; Zn; Zr; carbides of any of the foregoing metals (e.g., SiC, $Fe_3C$, WC, VC, MoC, NbC); silicides of any of the foregoing metals (e.g., $Mg_2Si$, $SrSi_2$, $Sn_2Si$); oxides of any of the foregoing metals (e.g., alumina, silica, titania, $SnO_2$, ZnO, NiO, $ZrO_2$, $HfO_2$), include transparent conducting oxides ("TCOs") such as indium tin oxide, aluminum doped zinc oxide (AZO), cadmium oxide (CdO), and fluorine doped tin oxide (FTO); sulfides of any of the foregoing metals (e.g., CdS, $MoS_2$, $SnS_2$); nitrides of any of the foregoing metals (e.g., GaN, $Mg_3N_2$, TiN, BN, $Si_3N_4$); selenides of any of the foregoing metals (e.g., CdSe, $FeS_2$, ZnSe); tellurides of any of the foregoing metals (e.g., CdTe, $TiTe_2$, ZnTe); phosphides of any of the foregoing metals (e.g., InP, GaP, GaInP); arsenides of any of the foregoing metals (e.g., $CoAs_3$, GaAs, InGaAs, NiAs); antimonides of any of the foregoing metals (e.g., AlSb, GaSb, InSb); halides of any of the foregoing metals (e.g., CuCl, CuI, $BiI_3$); pseudohalides of any of the foregoing metals (e.g., CuSCN, AuCN, $Fe(SCN)_2$); carbonates of any of the foregoing metals (e.g., $CaCO_3$, $Ce_2(CO_3)_3$); functionalized or non-functionalized alkyl silyl groups; graphite; graphene; fullerenes; carbon nanotubes; any mesoporous material and/or interfacial material discussed elsewhere herein; and combinations thereof (including, in some embodiments, bilayers, trilayers, or multilayers of combined materials). In some embodiments, an interfacial layer may include perovskite material. Further, interfacial layers may comprise doped embodiments of any interfacial material mentioned herein (e.g., Y-doped ZnO, N-doped single-wall carbon nanotubes). Interfacial layers may also comprise a compound having three of the above materials (e.g., $CuTiO_3$, $Zn_2SnO_4$) or a compound having four of the above materials (e.g., CoNiZnO). The materials listed above may be present in a planar, mesoporous or otherwise nano-structured form (e.g. rods, spheres, flowers, pyramids), or aerogel structure.

First, as previously noted, one or more IFLs (e.g., either or both IFLs 2626 and 2627 as shown in FIG. 1) may comprise a photoactive organic compound of the present disclosure as a self-assembled monolayer (SAM) or as a thin film. When a photoactive organic compound of the present disclosure is applied as a SAM, it may comprise a binding group through which it may be covalently or otherwise bound to the surface of either or both of the anode and cathode. The binding group of some embodiments may comprise any one or more of COOH, $SiX_3$ (where X may be any moiety suitable for forming a ternary silicon compound, such as $Si(OR)_3$ and $SiCl_3$), $SO_3$, POOH, OH, $CH_2X$ (where X may comprise a Group 17 halide), and O. The binding group may be covalently or otherwise bound to an electron-withdrawing moiety, an electron donor moiety, and/or a core moiety. The binding group may attach to the electrode surface in a manner so as to form a directional, organized layer of a single molecule (or, in some embodiments, multiple molecules) in thickness (e.g., where multiple photoactive organic compounds are bound to the anode and/or cathode). As noted, the SAM may attach via covalent interactions, but in some embodiments, it may attach via ionic, hydrogen-bonding, and/or dispersion force (i,e., Van Der Waals) interactions. Furthermore, in certain embodiments, upon light exposure, the SAM may enter into a zwitterionic excited state, thereby creating a highly-polarized IFL, which may direct charge carriers from an active layer into an electrode (e.g., either the anode or cathode). This enhanced charge-carrier injection may, in some embodiments, be accomplished by electronically poling the cross-section of the active layer and therefore increasing charge-carrier drift velocities towards their respective electrode (e.g., hole to anode; electrons to cathode). Molecules for anode applications of some embodiments may comprise tunable compounds that include a primary electron donor moiety bound to a core moiety, which in turn is bound to an electron-withdrawing moiety, which in turn is bound to a binding group. In cathode applications according to some embodiments, IFL molecules may comprise a tunable compound comprising an electron poor moiety bound to a core moiety, which in turn is bound to an electron donor moiety, which in turn is bound to a binding group. When a photoactive organic compound is employed as an IFL according to such embodiments, it may retain photoactive character, although in some embodiments it need not be photoactive.

Metal oxides may be used in thin film IFLs of some embodiments and may include semiconducting metal oxides, such as NiO, $SnO_2$, $WO_3$, $V_2O_5$, or $MoO_3$. The embodiment wherein the second (e.g., n-type) active material comprises $TiO_2$ coated with a thin-coat IFL comprising $Al_2O_3$ could be formed, for example, with a precursor material such as $Al(NO_3)_3 \cdot xH_2O$, or any other material suitable for depositing $Al_2O_3$ onto the $TiO_2$, followed by thermal annealing and dye coating. In example embodiments wherein a $MoO_3$ coating is instead used, the coating may be formed with a precursor material such as $Na_2Mo_4 \cdot 2H_2O$; whereas a $V_2O_5$ coating according to some embodiments may be formed with a precursor material such as $NaVO_3$; and a $WO_3$ coating according to some embodiments may be formed with a precursor material such as $NaWO_4 \cdot H_2O$. The concentration of precursor material (e.g., $Al(NO_3)_3 \cdot xH_2O$) may affect the final film thickness (here, of $Al_2O_3$) deposited on the $TiO_2$ or other active material. Thus, modifying the concentration of precursor material may be a method by which the final film thickness may be controlled. For example, greater film thickness may result from greater precursor material concentration. Greater film thickness may not necessarily result in greater PCE in a PV device comprising a metal oxide coating. Thus, a method of some embodiments may include coating a $TiO_2$ (or other mesoporous) layer using a precursor material having a concentration in the range of approximately 0.5 to 10.0 mM; other embodiments may include coating the layer with a precursor material having a concentration in the range of approximately 2.0 to 6.0 mM; or, in other embodiments, approximately 2.5 to 5.5 mM.

Furthermore, although referred to herein as $Al_2O_3$ and/or alumina, it should be noted that various ratios of aluminum and oxygen may be used in forming alumina. Thus, although some embodiments discussed herein are described with reference to $Al_2O_3$, such description is not intended to define a required ratio of aluminum in oxygen. Rather, embodiments may include any one or more aluminum-oxide compounds, each having an aluminum oxide ratio according to $Al_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $Al_xO_y$ may be present in various embodiments, such as alpha, gamma, and/or amorphous forms of alumina.

Likewise, although referred to herein as NiO, $MoO_3$, $WO_3$, and $V_2O_5$, such compounds may instead or in addition be represented as $Ni_xO_y$, $Mo_xO_y$, $W_xO_y$, and $V_xO_y$, respectively. Regarding each of $Mo_xO_y$ and $W_xO_y$, x may be any value, integer or non-integer, between approximately 0.5 and 100; in some embodiments, it may be between approximately 0.5 and 1.5. Likewise, y may be any value, integer or non-integer, between approximately 1 and 100. In some embodiments, y may be any value between approximately 1 and 4. Regarding $V_xO_y$, x may be any value, integer or non-integer, between approximately 0.5 and 100; in some embodiments, it may be between approximately 0.5 and 1.5. Likewise, y may be any value, integer or non-integer, between approximately 1 and 100; in certain embodiments, it may be an integer or non-integer value between approximately 1 and 10. In some embodiments, x and y may have values so as to be in a non-stoichiometric ratio.

In some embodiments, the IFL may comprise a titanate. A titanate according to some embodiments may be of the general formula $M'TiO_3$, where M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of titanate, which in other embodiments, the IFL may comprise two or more different species of titanates. In one embodiment, the titanate has the formula $SrTiO_3$. In another embodiment, the titanate may have the formula $BaTiO_3$. In yet another embodiment, the titanate may have the formula $CaTiO_3$.

By way of explanation, and without implying any limitation, titanates have a perovskite crystalline structure and strongly seed the perovskite material (e.g., methylammonium lead iodide ($MAPbI_3$), and formamidinium lead iodide ($FAPbI_3$)) growth conversion process. Titanates generally also meet other IFL requirements, such as ferroelectric behavior, sufficient charge carrier mobility, optical transparency, matched energy levels, and high dielectric constant.

In other embodiments, the IFL may comprise a zirconate. A zirconate according to some embodiments may be of the general formula $M'ZrO_3$, where M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of zirconate, which in other embodiments, the IFL may comprise two or more different species of zirconate. In one embodiment, the zirconate has the formula $SrZrO_3$. In another embodiment, the zirconate may have the formula $BaZrO_3$. In yet another embodiment, the zirconate may have the formula $CaZrO_3$.

By way of explanation, and without implying any limitation, zirconates have a perovskite crystalline structure and strongly seed the perovskite material (e.g., $MAPbI_3$, $FAPbI_3$) growth conversion process. Zirconates generally also meet other IFL requirements, such as ferroelectric behavior, sufficient charge carrier mobility, optical transparency, matched energy levels, and high dielectric constant.

In other embodiments, the IFL may comprise a stannate. A stannate according to some embodiments may be of the general formula $M'SnO_3$, or $M'_2SnO_4$ where M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of stannate, which in other embodiments, the IFL may comprise two or more different species of stannate. In one embodiment, the stannate has the formula $SrSnO_3$. In another embodiment, the stannate may have the formula $BaSnO_3$. In yet another embodiment, the stannate may have the formula $CaSnO_3$.

By way of explanation, and without implying any limitation, stannates have a perovskite crystalline structure and strongly seed the perovskite material (e.g., $MAPbI_3$, $FAPbI_3$) growth conversion process. Stannates generally also meet other IFL requirements, such as ferroelectric behavior, sufficient charge carrier mobility, optical transparency, matched energy levels, and high dielectric constant.

In other embodiments, the IFL may comprise a plumbate. A plumbate according to some embodiments may be of the general formula $M'PbO_3$, where M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of plumbate, which in other embodiments, the IFL may comprise two or more different species of plumbate. In one embodiment, the plumbate has the formula $SrPbO_3$. In another embodiment, the plumbate may have the formula $BaPbO_3$. In yet another embodiment, the plumbate may have the formula $CaPbO_3$. In yet another embodiment, the plumbate may have the formula $Pb^{II}Pb^{IV}O_3$.

By way of explanation, and without implying any limitation, plumbates have a perovskite crystalline structure and strongly seed the perovskite material (e.g., $MAPbI_3$, $FAPbI_3$) growth conversion process. Plumbates generally also meet other IFL requirements, such as ferroelectric behavior, sufficient charge carrier mobility, optical transparency, matched energy levels, and high dielectric constant.

Further, in other embodiments, an IFL may comprise a combination of a zirconate and a titanate in the general formula $M'[Zr_xTi_{1-x}]O_3$, where X is greater than 0 but less than one 1, and M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of zirconate, which in other embodiments, the IFL may comprise two or more different species of zirconate. In one embodiment, the zirconate/titanate combination has the formula $Pb[Zr_xTi_{1-x}]O_3$. In another embodiment, the zirconate/titanate combination has the formula $Pb[Zr_{0.52}Ti_{0.48}]O_3$.

By way of explanation, and without implying any limitation, a zirconate/titanate combination have a perovskite crystalline structure and strongly seed the perovskite material (e.g., $MAPbI_3$, $FAPbI_3$) growth conversion process. Zirconate/titanate combinations generally also meet other IFL requirements, such as ferroelectric behavior, sufficient charge carrier mobility, optical transparency, matched energy levels, and high dielectric constant.

In other embodiments, the IFL may comprise a niobate. A niobate according to some embodiments may be of the general formula $M'NbO_3$, where: M' comprises any 1+ cation. In some embodiments, M' may comprise a cationic form of Li, Na, K, Rb, Cs, Cu, Ag, Au, Tl, ammonium, or H. In some embodiments, the IFL may comprise a single species of niobate, which in other embodiments, the IFL may comprise two or more different species of niobate. In one embodiment, the niobate has the formula $LiNbO_3$. In another embodiment, the niobate may have the formula $NaNbO_3$. In yet another embodiment, the niobate may have the formula $AgNbO_3$.

By way of explanation, and without implying any limitation, niobates generally meet IFL requirements, such as piezoelectric behavior, non-linear optical polarizability, photoelasticity, ferroelectric behavior, Pockels effect, sufficient charge carrier mobility, optical transparency, matched energy levels, and high dielectric constant.

In one embodiment, a perovskite material device may be formulated by casting $PbI_2$ onto a $SrTiO_3$-coated ITO substrate. The $PbI_2$ may be converted to $MAPbI_3$ by a dipping process. This resulting conversion of $PbI_2$ to $MAPbI_3$ may be more complete (as observed by optical spectroscopy) as compared to the preparation of the substrate without $SrTiO_3$.

Any interfacial material discussed herein may further comprise doped compositions. To modify the characteristics (e.g., electrical, optical, mechanical) of an interfacial material, a stoichiometric or non-stoichiometric material may be doped with one or more elements (e.g., Na, Y, Mg, N, P) in amounts ranging from as little as 1 ppb to 50 mol %. Some examples of interfacial materials include: NiO, $TiO_2$, $SrTiO_3$, $Al_2O_3$, $ZrO_2$, $WO_3$, $V_2O_5$, $MO_3$, ZnO, graphene, and carbon black. Examples of possible dopants for these interfacial materials include: Li, Na, Be, Mg, Ca, Sr, Ba, Sc, Y, Nb, Ti, Fe, Co, Ni, Cu, Ga, Sn, In, B, N, P, C, S, As, a halide, a pseudohalide (e.g., cyanide, cyanate, isocyanate, fulminate, thiocyanate, isothiocyanate, azide, tetracarbonylcobaltate, carbamoyldicyanomethanide, dicyanonitrosomethanide, dicyanamide, and tricyanomethanide), and Al in any of its oxidation states. References herein to doped interfacial materials are not intended to limit the ratios of component elements in interfacial material compounds.

In some embodiments, multiple IFLs made from different materials may be arranged adjacent to each other to form a composite IFL. This configuration may involve two different IFLs, three different IFLs, or an even greater number of different IFLs. The resulting multi-layer IFL or composite IFL may be used in lieu of a single-material IFL. For example, a composite IFL may be used any IFL shown in the example of FIG. 2, such as IFL 3903, IFL 3905, IFL 3907, IFL 3909, or IFL 3911. While the composite IFL differs from a single-material IFL, the assembly of a perovskite material PV cell having multi-layer IFLs is not substantially different than the assembly of a perovskite material PV cell having only single-material IFLs.

Generally, the composite IFL may be made using any of the materials discussed herein as suitable for an IFL. In one embodiment, the IFL comprises a layer of $Al_2O_3$ and a layer of ZnO or M:ZnO (doped ZnO, e.g., Be:ZnO, Mg:ZnO, Ca:ZnO, Sr:ZnO, Ba:ZnO, Sc:ZnO, Y:ZnO, Nb:ZnO). In an embodiment, the IFL comprises a layer of $ZrO_2$ and a layer of ZnO or M:ZnO. In certain embodiments, the IFL comprises multiple layers. In some embodiments, a multi-layer IFL generally has a conductor layer, a dielectric layer, and a semi-conductor layer. In particular embodiments the layers may repeat, for example, a conductor layer, a dielectric layer, a semi-conductor layer, a dielectric layer, and a semi-conductor layer. Examples of multi-layer IFLs include an IFL having an ITO layer, an $Al_2O_3$ layer, a ZnO layer, and a second $Al_2O_3$ layer; an IFL having an ITO layer, an $Al_2O_3$ layer, a ZnO layer, a second $Al_2O_3$ layer, and a second ZnO layer; an IFL having an ITO layer, an $Al_2O_3$ layer, a ZnO layer, a second $Al_2O_3$ layer, a second ZnO layer, and a third $Al_2O_3$ layer; and IFLs having as many layers as necessary to achieve the desired performance characteristics. As discussed previously, references to certain stoichiometric ratios are not intended to limit the ratios of component elements in IFL layers according to various embodiments.

Arranging two or more adjacent IFLs as a composite IFL may outperform a single IFL in perovskite material PV cells where attributes from each IFL material may be leveraged in a single IFL. For example, in the architecture having an ITO layer, an $Al_2O_3$ layer, and a ZnO layer, where ITO is a conducting electrode, $Al_2O_3$ is a dielectric material and ZnO is a n-type semiconductor, ZnO acts as an electron acceptor with well performing electron transport properties (e.g., mobility). Additionally, $Al_2O_3$ is a physically robust material that adheres well to ITO, homogenizes the surface by capping surface defects (e.g., charge traps), and improves device diode characteristics through suppression of dark current.

Additionally, some perovskite material PV cells may include so called "tandem" PV cells having more than one perovskite photoactive layer. For example, both photoactive materials 3908 and 3906 of FIG. 2 may be perovskite materials. In such tandem PV cells an interfacial layer between the two photoactive layers, such as IFL 3907 of FIG. 2 may comprise a multi-layer, or composite, IFL. In some embodiments, the layers sandwiched between the two photoactive layers of a tandem PV device may include an electrode layer.

A tandem PV device may include the following layers, listed in order from either top to bottom or bottom to top: a first substrate, a first electrode, a first interfacial layer, a first perovskite material, a second interfacial layer, a second electrode, a third interfacial layer, a second perovskite material, a fourth interfacial layer, and a third electrode. In some embodiments, the first and third interfacial layers may be hole transporting interfacial layers and the second and fourth interfacial layers may be electron transporting interfacial layers. In other embodiments, the first and third interfacial layers may be electron transporting interfacial layers and the second and fourth interfacial layers may be hole transporting interfacial layers. In yet other embodiments, the first and fourth interfacial layers may be hole transporting interfacial layers and the second and third interfacial layers may be electron transporting interfacial layers. In other embodiments, the first and fourth interfacial layers may be electron transporting interfacial layers and the second and third interfacial layers may be hole transporting interfacial layers. In tandem PV devices the first and second perovskite materials may have different band gaps. In some embodiments, the first perovskite material may be formamidinium lead bromide ($FAPbBr_3$) and the second perovskite material may be formamidinium lead iodide ($FAPbI_3$). In other embodiments, the first perovskite material may be methylammonium lead bromide ($MAPbBr_3$) and the second perovskite material may be formamidinium lead iodide ($FaPbI_3$). In other embodiments, the first perovskite material may be methylammonium lead bromide ($MAPbBr_3$) and the second perovskite material may be methylammonium lead iodide ($MAPbI_3$). Tandem PVs may include "2-terminal" tandem cells, "3-terminal" tandem cells, and "4-terminal" tandem cells. In a 2-terminal tandem cell, a PV cell, such as device 3900, may be connected to electrical leads by electrodes near the edges of the PV cell, such as electrodes 3912 and 3902. In a 3-terminal tandem device, the PV cell may be connected to electrical leads by two electrodes near the edges of the PV cell, such as electrodes 3912 and 3902, and by a third electrode disposed within the interior of the cell between the two photoactive layers, such as an electrode disposed in layer 3907. In a 4-terminal cell, a PV cell may be connected to electrical leads by two electrodes near the edges of the PV cell, such as electrodes 3912 and 3902, and by two electrodes that are separated by a transparent, non-conductive layer and are disposed within the interior of the PV cell between the two photoactive layers. For example, in a 4-terminal device, layer 3907 may include, among other layers, two electrodes separated by a transparent, non-conductive layer, such as glass. Stylized illustrations of a 2-terminal tandem cell, a 3-terminal tandem cell, and a 4-terminal tandem cell are illustrated in FIGS. 16, 17, and 18, respectively.

Figure 16:
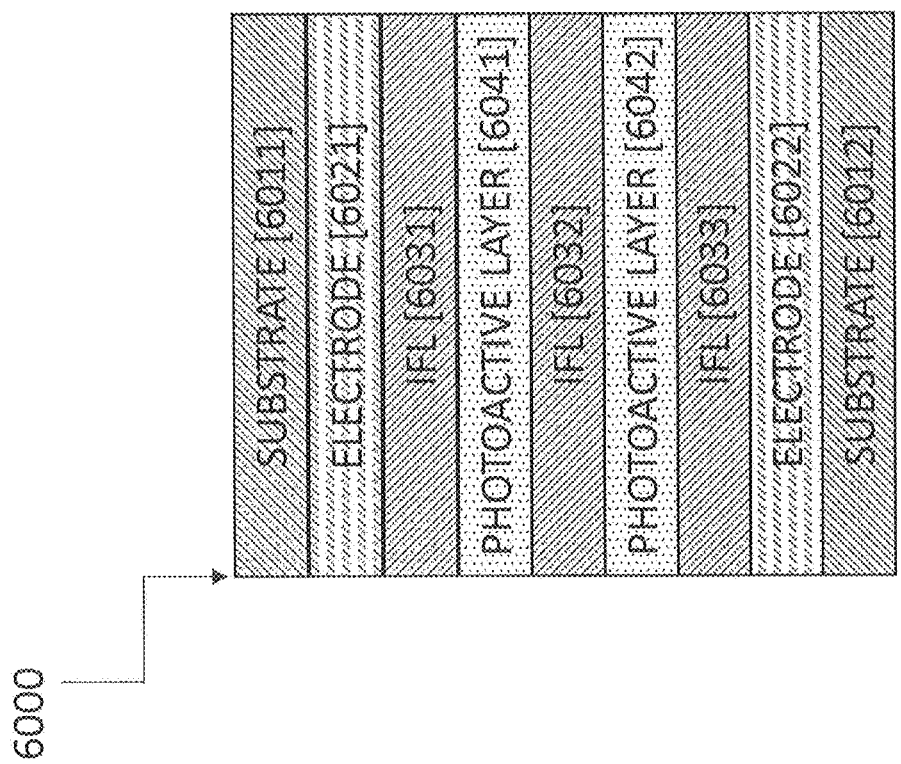
FIG. 16 is a stylized diagram of 2-terminal photovoltaic cell according to some embodiments of the present disclosure.

FIG. 16 illustrates a 2-terminal tandem PV cell 6000. PV cell 6000 includes two electrically conductive electrode layers, a first electrode layer 6021 and a second electrode layer 6022. Electrode layers 6021 and 6022 may be transparent conductors such as tin-doped indium oxide (ITO) or any other material as described herein. In other embodiments, electrode layers 6021 and 6022 may be a metal, such as aluminum, or other conducive material such as carbon. PV cell 6000 also includes interfacial layers (IFL) 6031, 6032, and 6033. IFLs 6031, 6032, and 6033 may assist in charge recombination. In some embodiments, each IFL layer may be a multi-layer IFL. An IFL may be intrinsic, ambipolar, p-type, or n-type semiconducting materials or may be a dielectric material. PV cell 6000 may be attached to electrical leads by electrodes 6021 and 6022, which may connect PV cell 6000 to a discharge unit, such as a battery, motor, capacitor, electric grid, or any other electrical load.

Figure 17:
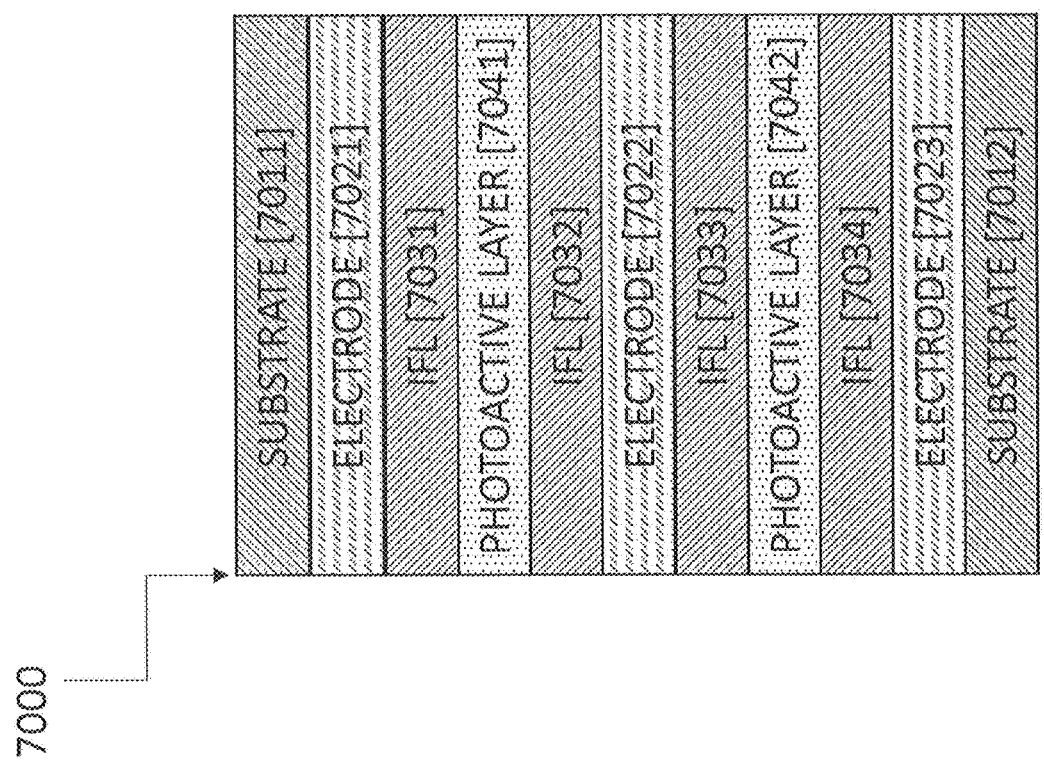
FIG. 17 is a stylized diagram of 3-terminal photovoltaic cell according to some embodiments of the present disclosure.

FIG. 17 illustrates a 3-terminal PV cell 7000. PV cell 7000 may be attached to electrical leads by electrode 7021, an electrode 7022 embedded within IFLs 7032 and 7033, and electrode 7023. In some embodiments, electrode layers 7021 and 7023 may be cathodes and electrode layer 7022 may be an anode. In other embodiments, electrode layers 7021 and 7023 may be anodes and electrode layer 7022 may be a cathode. As with PV cell 6000 illustrated in FIG. 16, IFLs 7031, 7032, 7033, and 7034 may be single or multi-layer IFLs and may be intrinsic, ambipolar, p-type, or n-type semiconducting materials or may be a dielectric material. In embodiments in which electrode layer 7022 is a cathode, IFLs 7032 and 7033 may be electron transporting layers (n-type layers). In embodiments in which electrode layer 7022 is an anode, IFLs 7032 and 7033 may be hole transporting layers (p-type). In some embodiments, one or more of IFLs 7031, 7032, 7033, or 7034 may be omitted from PV cell 7000.

Figure 18:
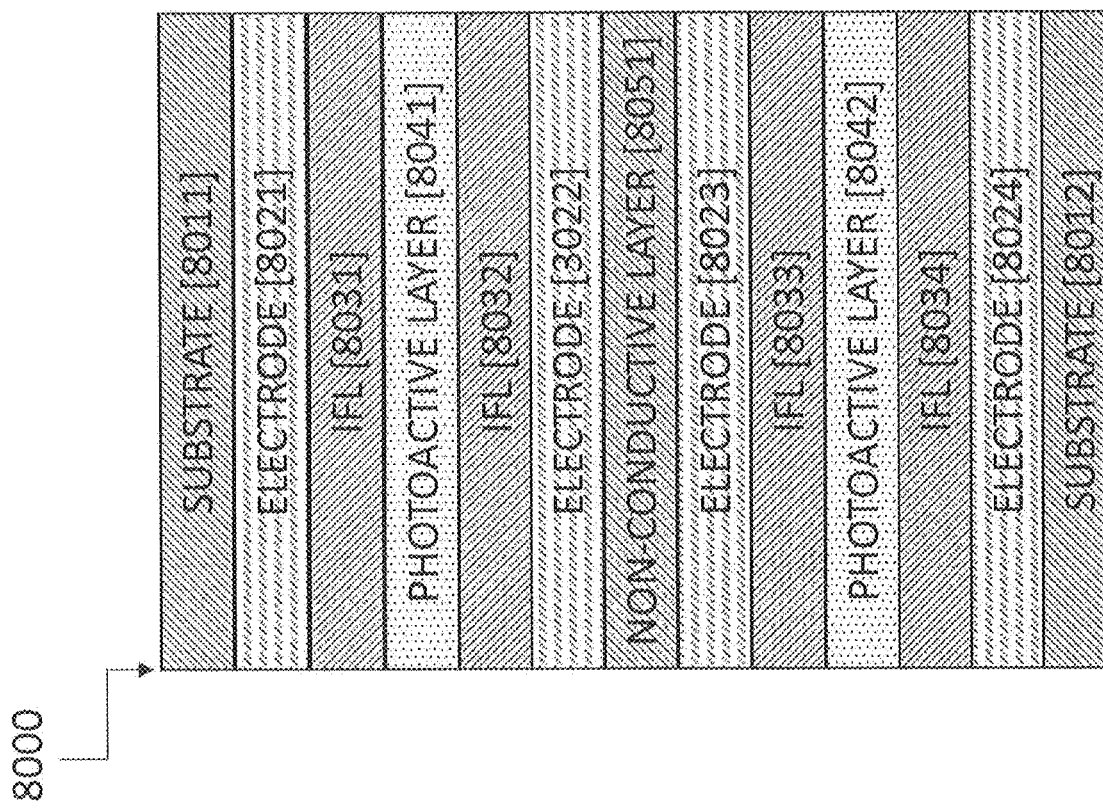
FIG. 18 is a stylized diagram of 4-terminal photovoltaic cell according to some embodiments of the present disclosure.

FIG. 18 illustrates a 4-terminal PV cell 8000. PV cell 8000 may be attached to electrical leads by electrode layers 8021, 8022, 8023, and 8024. In some embodiments, electrode layer 8021 may be an anode and electrode layer 8022 may be a cathode, and electrode layer 8024 may be an anode and electrode layer 8023 may be a cathode. In other embodiments, electrode layer 8021 may be an anode and electrode layer 8022 may be a cathode, and electrode layer 8024 may be a cathode and electrode layer 8023 may be an anode. In other embodiments, electrode layer 8021 may be a cathode and electrode layer 8022 may be anode, and electrode layer 8024 may be a cathode and electrode layer 8023 may be an anode. In other embodiments, electrode layer 8021 may be a cathode and electrode layer 8022 may be anode, and electrode layer 8024 may be an anode and electrode layer 8023 may be a cathode. A 4-terminal design tandem solar cell device may, in some embodiments, include two devices made up of monolithically stacked layers. The two devices may be joined using a layer of adhesive, epoxy, glass, laminate, or any combination thereof. For example, with reference to FIG. 18, a first device may include substrate 8011, electrode layer 8021, IFL 8031, photoactive layer 8041, IFL 8032, and electrode layer 8022, and a second device may include substrate 8012, electrode layer 8024, IFL 8034, photoactive layer 8042, IFL 8033, and electrode layer 8023. These devices may be joined by transparent, non-conductive layer 8051, which may be an adhesive, epoxy, glass, laminate, or combination thereof.

As with PV cell 6000 and PV cell 7000 illustrated in FIGS. 16 and 17, IFLs 8031, 8032, 8033, and 8034 may be single or multi-layer IFLs and may be intrinsic, ambipolar, p-type, or n-type semiconducting materials or may be a dielectric material. In embodiments in which electrode layer 8022 and/or electrode layer 8023 is a cathode, IFL 8032 and/or IFL 8033 may be electron transporting layers (n-type layers). In embodiments in which electrode layer 8022 and/or electrode layer 8023 is an anode, IFL 8032 and/or IFL 8033 may be hole transporting layers (p-type). In some embodiments, one or more of IFLs 8031, 8032, 8033, or 8034 may be omitted from PV cell 8000. Non-conductive layer 8051, may be any transparent material that does not conduct electricity between electrode layer 8022 and electrode layer 8023. For example, non-conductive layer 8051 may be glass, quartz, sapphire, silicon carbide, or a transparent polymer such as polycarbonate or poly(methyl methacrylate) (PMMA). In some embodiments, transparent non-conductive layer 8051 may be assembled from two transparent non-conductive layers fused through application of pressure and/or temperature as described here. In such embodiments, transparent non-conductive layer 8051 may include a thin polymer or adhesive layer placed between the layers prior to fusing.

Composite Perovskite Material Device Design

In some embodiments, the present disclosure may provide composite design of PV and other similar devices (e.g., batteries, hybrid PV batteries, FETs, LEDs, nonlinear optics (NLOs), waveguides, etc.) including one or more perovskite materials. For example, one or more perovskite materials may serve as either or both of first and second active material of some embodiments (e.g., active materials 3906*a* and 3908*a* of FIG. 3). In more general terms, some embodiments of the present disclosure provide PV or other devices having an active layer comprising one or more perovskite materials. In such embodiments, perovskite material (that is, material including any one or more perovskite materials(s)) may be employed in active layers of various architectures. Furthermore, perovskite material may serve the function(s) of any one or more components of an active layer (e.g., charge transport material, mesoporous material, photoactive material, and/or interfacial material, each of which is discussed in greater detail below). In some embodiments, the same perovskite materials may serve multiple such functions, although in other embodiments, a plurality of perovskite materials may be included in a device, each perovskite material serving one or more such functions. In certain embodiments, whatever role a perovskite material may serve, it may be prepared and/or present in a device in various states. For example, it may be substantially solid in some embodiments. A solution or suspension may be coated or otherwise deposited within a device (e.g., on another component of the device such as a mesoporous, interfacial, charge transport, photoactive, or other layer, and/or on an electrode). Perovskite materials in some embodiments may be formed in situ on a surface of another component of a device (e.g., by vapor deposition as a thin-film solid). Any other suitable means of forming a layer comprising perovskite material may be employed.

In general, a perovskite material device may include a first electrode, a second electrode, and an active layer comprising a perovskite material, the active layer disposed at least partially between the first and second electrodes. In some embodiments, the first electrode may be one of an anode and a cathode, and the second electrode may be the other of an anode and cathode. An active layer according to certain embodiments may include any one or more active layer components, including any one or more of: charge transport material; liquid electrolyte; mesoporous material; photoactive material (e.g., a dye, silicon, cadmium telluride, cadmium sulfide, cadmium selenide, copper indium gallium selenide, gallium arsenide, germanium indium phosphide, semiconducting polymers, other photoactive materials)); and interfacial material. Any one or more of these active layer components may include one or more perovskite materials. In some embodiments, some or all of the active layer components may be in whole or in part arranged in sub-layers. For example, the active layer may comprise any one or more of: an interfacial layer including interfacial material; a mesoporous layer including mesoporous material; and a charge transport layer including charge transport material. Further, an interfacial layer may be included between any two or more other layers of an active layer according to some embodiments and/or between an active layer component and an electrode. Reference to layers herein may include either a final arrangement (e.g., substantially discrete portions of each material separately definable within the device), and/or reference to a layer may mean arrangement during construction of a device, notwithstanding the possibility of subsequent intermixing of material(s) in each layer. Layers may in some embodiments be discrete and comprise substantially contiguous material (e.g., layers may be as stylistically illustrated in FIG. 2).

In some embodiments, a perovskite material device may be a field effect transistor (FET). An FET perovskite material device may include a source electrode, drain electrode, gate electrode, dielectric layer, and a semiconductor layer. In some embodiments the semiconductor layer of an FET perovskite material device may be a perovskite material.

A perovskite material device according to some embodiments may optionally include one or more substrates. In some embodiments, either or both of the first and second electrode may be coated or otherwise disposed upon a substrate, such that the electrode is disposed substantially between a substrate and the active layer. The materials of composition of devices (e.g., substrate, electrode, active layer and/or active layer components) may in whole or in part be either rigid or flexible in various embodiments. In some embodiments, an electrode may act as a substrate, thereby negating the need for a separate substrate.

Furthermore, a perovskite material device according to certain embodiments may optionally include an anti-reflective layer or anti-reflective coating (ARC). In addition, a perovskite material device may include any one or more additives, such as any one or more of the additives discussed above with respect to some embodiments of the present disclosure.

Figure 2:
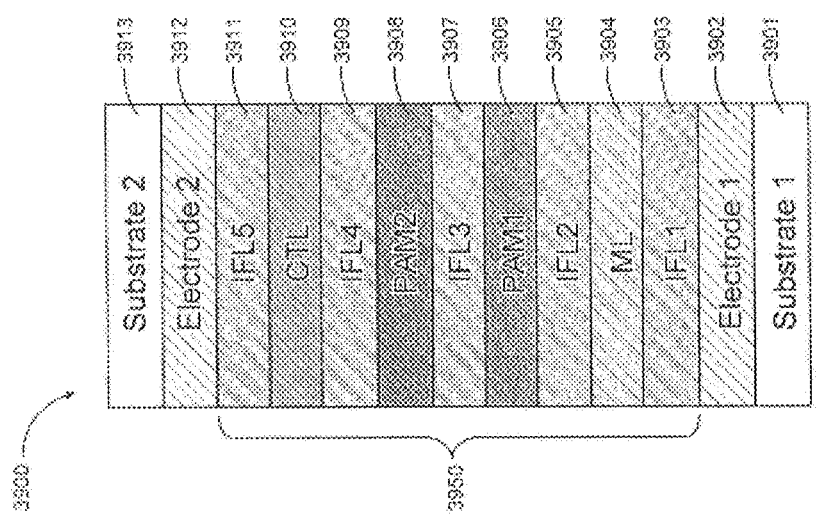
FIG. 2 is a stylized diagram showing components of an example PV device according to some embodiments of the present disclosure.

Description of some of the various materials that may be included in a perovskite material device will be made in part with reference to FIG. 2. FIG. 2 is a stylized diagram of a perovskite material device 3900 according to some embodiments. Although various components of the device 3900 are illustrated as discrete layers comprising contiguous material, it should be understood that FIG. 2 is a stylized diagram; thus, embodiments in accordance with it may include such discrete layers, and/or substantially intermixed, non-contiguous layers, consistent with the usage of "layers" previously discussed herein. The device 3900 includes first and second substrates 3901 and 3913. A first electrode 3902 is disposed upon an inner surface of the first substrate 3901, and a second electrode 3912 is disposed on an inner surface of the second substrate 3913. An active layer 3950 is sandwiched between the two electrodes 3902 and 3912. The active layer 3950 includes a mesoporous layer 3904; first and second photoactive materials 3906 and 3908; a charge transport layer 3910, and several interfacial layers. FIG. 2 furthermore illustrates an example device 3900 according to embodiments wherein sub-layers of the active layer 3950 are separated by the interfacial layers, and further wherein interfacial layers are disposed upon each electrode 3902 and 3912. In particular, second, third, and fourth interfacial layers 3905, 3907, and 3909 are respectively disposed between each of the mesoporous layer 3904, first photoactive material 3906, second photoactive material 3908, and charge transport layer 3910. First and fifth interfacial layers 3903 and 3911 are respectively disposed between (i) the first electrode 3902 and mesoporous layer 3904; and (ii) the charge transport layer 3910 and second electrode 3912. Thus, the architecture of the example device depicted in FIG. 2 may be characterized as: substrate-electrode-active layer-electrode-substrate. The architecture of the active layer 3950 may be characterized as: interfacial layer-mesoporous layer-interfacial layer-photoactive material-interfacial layer-photoactive material-interfacial layer-charge transport layer-interfacial layer. As noted previously, in some embodiments, interfacial layers need not be present; or, one or more interfacial layers may be included only between certain, but not all, components of an active layer and/or components of a device.

A substrate, such as either or both of first and second substrates 3901 and 3913, may be flexible or rigid. If two substrates are included, at least one should be transparent or translucent to electromagnetic (EM) radiation (such as, e.g., UV, visible, or IR radiation). If one substrate is included, it may be similarly transparent or translucent, although it need not be, so long as a portion of the device permits EM radiation to contact the active layer 3950. Suitable substrate materials include any one or more of: glass; sapphire; magnesium oxide (MgO); mica; polymers (e.g., PEN, PET, PEG, polyolefin, polypropylene, polyethylene, polycarbonate, PMMA, polyamide, vinyl Kapton, etc.); ceramics; carbon; composites (e.g., fiberglass, Kevlar; carbon fiber); fabrics (e.g., cotton, nylon, silk, wool); wood; drywall; tiles (e.g. ceramic, composite, or clay); metal; steel; silver; gold; aluminum; magnesium; concrete; and combinations thereof.

As previously noted, an electrode (e.g., one of electrodes 3902 and 3912 of FIG. 2) may be either an anode or a cathode. In some embodiments, one electrode may function as a cathode, and the other may function as an anode. Either or both electrodes 3902 and 3912 may be coupled to leads, cables, wires, or other means enabling charge transport to and/or from the device 3900. An electrode may constitute any conductive material, and at least one electrode should be transparent or translucent to EM radiation, and/or be arranged in a manner that allows EM radiation to contact at least a portion of the active layer 3950. Suitable electrode materials may include any one or more of: indium tin oxide or tin-doped indium oxide (ITO); fluorine-doped tin oxide (FTO); cadmium oxide (CdO); zinc indium tin oxide (ZITO); aluminum zinc oxide (AZO); aluminum (Al); gold (Au); silver (Ag); calcium (Ca); chromium (Cr); magnesium (Mg); titanium (Ti); steel; carbon (and allotropes thereof); doped carbon (e.g., nitrogen-doped); nanoparticles in core-shell configurations (e.g., silicon-carbon core-shell structure); and combinations thereof.

Mesoporous material (e.g., the material included in mesoporous layer 3904 of FIG. 2) may include any pore-containing material. In some embodiments, the pores may have diameters ranging from about 1 to about 100 nm; in other embodiments, pore diameter may range from about 2 to about 50 nm. Suitable mesoporous material includes any one or more of: any interfacial material and/or mesoporous material discussed elsewhere herein; aluminum (Al); bismuth (Bi); cerium (Ce); hafnium (Hf); indium (In); molybdenum (Mo); niobium (Nb); nickel (Ni); silicon (Si); titanium (Ti); vanadium (V); zinc (Zn); zirconium (Zr); an oxide of any one or more of the foregoing metals (e.g., alumina, ceria, titania, zinc oxide, zirconia, etc.); a sulfide of any one or more of the foregoing metals; a nitride of any one or more of the foregoing metals; and combinations thereof. In some embodiments, any material disclosed herein as an IFL may be a mesoporous material. In other embodiments, the device illustrated by FIG. 2 may not include a mesoporous material layer and include only thin-film, or "compact," IFLs that are not mesoporous.

Photoactive material (e.g., first or second photoactive material 3906 or 3908 of FIG. 2) may comprise any photoactive compound, such as any one or more of silicon (for example, polycrystalline silicon, single-crystalline silicon, or amorphous silicon), cadmium telluride, cadmium sulfide, cadmium selenide, copper indium gallium selenide, copper indium selenide, copper zinc tin sulfide, gallium arsenide, germanium, germanium indium phosphide, indium phosphide, one or more semiconducting polymers (e.g., polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT), polybenzodithiophenyl-thienothiophenediyl and derivatives thereof (e.g., PTB6, PTB7, PTB7-th, PCE-10); poly(triaryl amine) compounds and derivatives thereof (e.g., PTAA); polyphenylene vinylenes and derivatives thereof (e.g., MDMO-PPV, MEH-PPV), and combinations thereof.

In certain embodiments, photoactive material may instead or in addition comprise a dye (e.g., N719, N3, other ruthenium-based dyes). In some embodiments, a dye (of whatever composition) may be coated onto another layer (e.g., a mesoporous layer and/or an interfacial layer). In some embodiments, photoactive material may include one or more perovskite materials. Perovskite-material-containing photoactive substance may be of a solid form, or in some embodiments it may take the form of a dye that includes a suspension or solution comprising perovskite material. Such a solution or suspension may be coated onto other device components in a manner similar to other dyes. In some embodiments, solid perovskite-containing material may be deposited by any suitable means (e.g., vapor deposition, solution deposition, direct placement of solid material, etc.). Devices according to various embodiments may include one, two, three, or more photoactive compounds (e.g., one, two, three, or more perovskite materials, dyes, or combinations thereof). In certain embodiments including multiple dyes or other photoactive materials, each of the two or more dyes or other photoactive materials may be separated by one or more interfacial layers. In some embodiments, multiple dyes and/or photoactive compounds may be at least in part intermixed.

Charge transport material (e.g., charge transport material of charge transport layer 3910 in FIG. 2) may include solid-state charge transport material (i.e., a colloquially labeled solid-state electrolyte), or it may include a liquid electrolyte and/or ionic liquid. Any of the liquid electrolyte, ionic liquid, and solid-state charge transport material may be referred to as charge transport material. As used herein, "charge transport material" refers to any material, solid, liquid, or otherwise, capable of collecting charge carriers and/or transporting charge carriers. For instance, in PV devices according to some embodiments, a charge transport material may be capable of transporting charge carriers to an electrode. Charge carriers may include holes (the transport of which could make the charge transport material just as properly labeled "hole transport material") and electrons. Holes may be transported toward an anode, and electrons toward a cathode, depending upon placement of the charge transport material in relation to either a cathode or anode in a PV or other device. Suitable examples of charge transport material according to some embodiments may include any one or more of: perovskite material; $I^-/I_3^-$; Co complexes; polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT), polybenzodithiophenyl-thienothiophenediyl and derivatives thereof (e.g., PTB6, PTB7, PTB7-th, PCE-10); poly(triaryl amine) compounds and derivatives thereof (e.g., PTAA); Spiro-OMeTAD; polyphenylene vinylenes and derivatives thereof (e.g., MDMO-PPV, MEH-PPV); fullerenes and/or fullerene derivatives (e.g., C60, PCBM); carbon nanotubes; graphite; graphene; carbon black; amorphous carbon; glassy carbon; carbon fiber; and combinations thereof. In certain embodiments, charge transport material may include any material, solid or liquid, capable of collecting charge carriers (electrons or holes), and/or capable of transporting charge carriers. Charge transport material of some embodiments therefore may be n- or p-type active, ambipolar, and/or intrinsic semi-conducting material. Charge transport material may be disposed proximate to one of the electrodes of a device. It may in some embodiments be disposed adjacent to an electrode, although in other embodiments an interfacial layer may be disposed between the charge transport material and an electrode (as shown, e.g., in FIG. 2 with the fifth interfacial layer 3911). In certain embodiments, the type of charge transport material may be selected based upon the electrode to which it is proximate. For example, if the charge transport material collects and/or transports holes, it may be proximate to an anode so as to transport holes to the anode. However, the charge transport material may instead be placed proximate to a cathode and be selected or constructed so as to transport electrons to the cathode.

As previously noted, devices according to various embodiments may optionally include an interfacial layer between any two other layers and/or materials, although devices according to some embodiments need not contain any interfacial layers. Thus, for example, a perovskite material device may contain zero, one, two, three, four, five, or more interfacial layers (such as the example device of FIG. 2, which contains five interfacial layers 3903, 3905, 3907, 3909, and 3911). An interfacial layer may include a thin-coat interfacial layer in accordance with embodiments previously discussed herein (e.g., comprising alumina and/or other metal-oxide particles, and/or a titania/metal-oxide bilayer, and/or other compounds in accordance with thin-coat interfacial layers as discussed elsewhere herein). An interfacial layer according to some embodiments may include any suitable material for enhancing charge transport and/or collection between two layers or materials; it may also help prevent or reduce the likelihood of charge recombination once a charge has been transported away from one of the materials adjacent to the interfacial layer. Suitable interfacial materials may include any one or more of: any mesoporous material and/or interfacial material discussed elsewhere herein; Ag; Al; Au; B; Bi; Ca; Cd; Ce; Co; Cu; Fe; Ga; Ge; H; In; Mg; Mn; Mo; Nb; Ni; Pt; Sb; Sc; Si; Sn; Ta; Ti; V; W; Y; Zn; Zr; carbides of any of the foregoing metals (e.g., SiC, Fe$_3$C; WC); silicides of any of the foregoing metals (e.g., Mg$_2$Si, SrSi$_2$, Sn$_2$Si); oxides of any of the foregoing metals (e.g., alumina, silica, titania, SnO$_2$, ZnO); sulfides of any of the foregoing metals (e.g., CdS, MoS$_2$, SnS$_2$); nitrides of any of the foregoing metals (e.g., Mg$_3$N$_2$, TiN, BN, Si$_3$N$_4$); selenides of any of the foregoing metals (e.g., CdSe, FeS$_2$, ZnSe); tellurides of any of the foregoing metals (e.g., CdTe, TiTe$_2$, ZnTe); phosphides of any of the foregoing metals (e.g., InP, GaP); arsenides of any of the foregoing metals (e.g., CoAs$_3$, GaAs, InGaAs, NiAs); antimonides of any of the foregoing metals (e.g., AlSb, GaSb, InSb); halides of any of the foregoing metals (e.g., CuCl, CuI, BiI$_3$); pseudohalides of any of the foregoing metals (e.g., CuSCN, AuCN$_2$); carbonates of any of the foregoing metals (e.g., CaCO$_3$, Ce$_2$(CO$_3$)$_3$); functionalized or non-functionalized alkyl silyl groups; graphite; graphene; fullerenes; carbon nanotubes; any mesoporous material and/or interfacial material discussed elsewhere herein; and combinations thereof (including, in some embodiments, bilayers, trilayers, or multilayers of combined materials). In some embodiments, an interfacial layer may include perovskite material. Further, interfacial layers may comprise doped embodiments of any interfacial material mentioned herein (e.g., Y-doped ZnO, N-doped single-wall carbon nanotubes). Interfacial layers may also comprise a compound having three of the above materials (e.g., CuTiO$_3$, Zn$_2$SnO$_4$) or a compound having four of the above materials (e.g., CoNiZnO).

Figure 3:
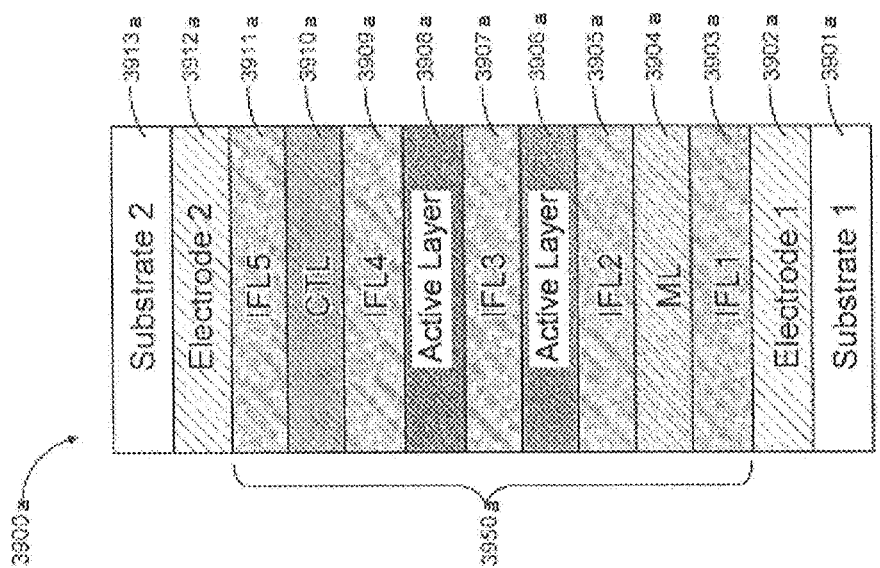
FIG. 3 is a stylized diagram showing components of an example device according to some embodiments of the present disclosure.

As an example, FIG. 3 illustrates an embodiment of a perovskite material device 3900a having a similar structure to perovskite material device 3900 illustrated by FIG. 2. FIG. 3 is a stylized diagram of a perovskite material device 3900a according to some embodiments. Although various components of the device 3900a are illustrated as discrete layers comprising contiguous material, it should be understood that FIG. 3 is a stylized diagram; thus, embodiments in accordance with it may include such discrete layers, and/or substantially intermixed, non-contiguous layers, consistent with the usage of "layers" previously discussed herein. FIG. 3 includes an active layers 3906a and 3908a. One or both of active layers 3906a and 3908a may, in some embodiments, include any perovskite photoactive materials described above with respect to FIG. 2. In other embodiments, one or both of active layers 3906a and 3908a may include any photoactive material described herein, such as, thin film semiconductors (e.g., CdTe, CZTS, CIGS), photoactive polymers, dye sensitized photoactive materials, fullerenes, small molecule photoactive materials, and crystalline and polycrystalline semiconductor materials (e.g., silicon, GaAs, InP, Ge). In yet other embodiments, one or both of active layers 3906a and 3908a may include a light emitting diode (LED), field effect transistor (FET), thin film battery layer, or combinations thereof. In embodiments, one of active layers 3906a and 3908a may include a photoactive material and the other may include a light emitting diode (LED), field effect transistor (FET), thin film battery layer, or combinations thereof. For example, active layer 3908a may comprise a perovskite material photoactive layer and active layer 3906b may comprise a field effect transistor layer. Other layers illustrated of FIG. 3, such as layers 3901a, 3902a, 3903a, 3904a, 3905a, 3907a, 3909a, 3910a, 3911a, 3912a, and 3913a, may be analogous to such corresponding layers as described herein with respect to FIG. 2.

Figure 4:
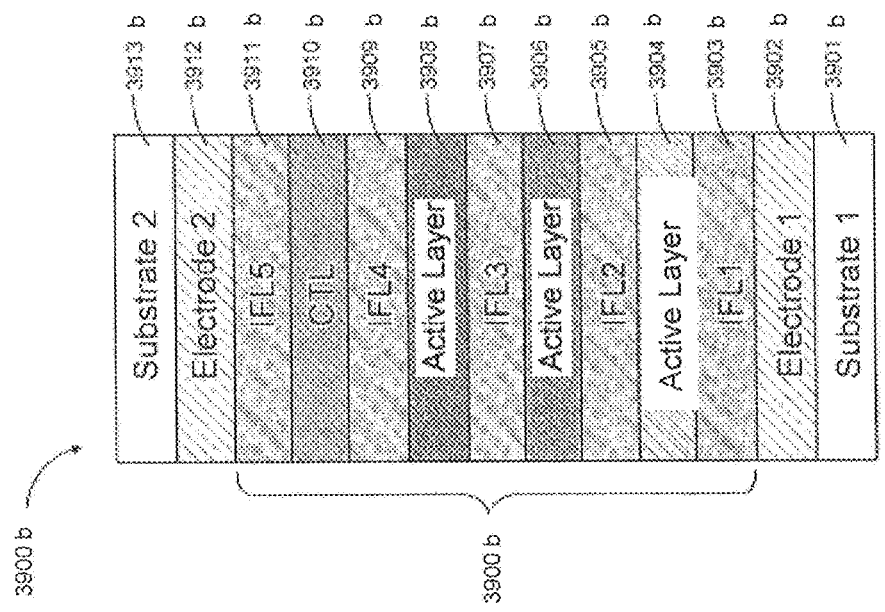
FIG. 4 is a stylized diagram showing components of an example device according to some embodiments of the present disclosure.

Additionally, in some embodiments, a perovskite material may have three or more active layers. As an example, FIG. 4 illustrates an embodiment of a perovskite material device 3900b having a similar structure to perovskite material device 3900 illustrated by FIG. 2. FIG. 3 is a stylized diagram of a perovskite material device 3900b according to some embodiments. Although various components of the device 3900b are illustrated as discrete layers comprising contiguous material, it should be understood that FIG. 4 is a stylized diagram; thus, embodiments in accordance with it may include such discrete layers, and/or substantially intermixed, non-contiguous layers, consistent with the usage of "layers" previously discussed herein. FIG. 4 includes an active layers 3904b, 3906b and 3908b. One or more of active layers 3904b, 3906b and 3908b may, in some embodiments, include any perovskite photoactive materials described above with respect to FIG. 2. In other embodiments, one or more of active layers 3904b, 3906b and 3908b may include any photoactive material described herein, such as, thin film semiconductors (e.g., CdTe, CZTS, CIGS), photoactive polymers, dye sensitized photoactive materials, fullerenes, small molecule photoactive materials, and crystalline and polycrystalline semiconductor materials (e.g., silicon, GaAs, InP, Ge). In yet other embodiments, one or more of active layers 3904b, 3906b and 3908b may include a light emitting diode (LED), field effect transistor (FET), thin film battery layer, or combinations thereof. In embodiments, one or more of active layers of active layers 3904b, 3906b and 3908b may include a photoactive material and the other may include a light emitting diode (LED), field effect transistor (FET), thin film battery layer, or combinations thereof. For example, active layer 3908a and 3906b may both comprise perovskite material photoactive layers and active layer 3904b may comprise a field effect transistor layer. Other layers illustrated of FIG. 3, such as layers 3901b, 3902b, 3903b, 3904b, 3905b, 3907b, 3909b, 3910b, 3911b, 3912b, and 3913b, may be analogous to such corresponding layers as described herein with respect to FIG. 2.

Method for Manufacturing Perovskite Material Devices

Figure 5:
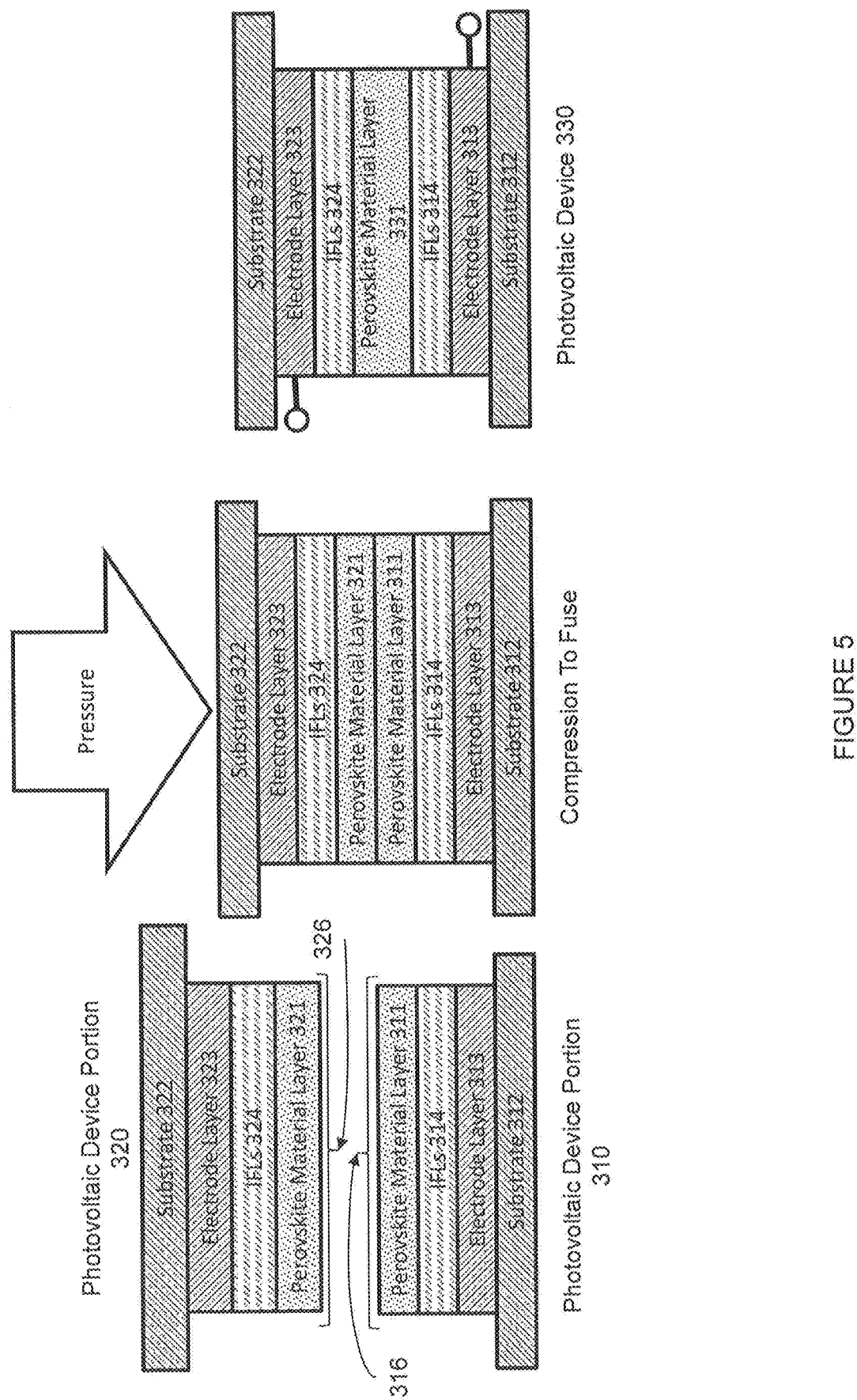
FIG. 5 is a stylized diagram showing a method for assembly of an example device according to some embodiments of the present disclosure.

FIG. 5 is a stylized diagram of a method for assembling an example photovoltaic device 330, according to certain embodiments. First, a first photovoltaic device portion 310 with a first perovskite material layer 311 having a face 316 is fabricated. Next, a second photovoltaic device portion 321 with a second perovskite material layer 321 having a face 326 is fabricated. Next, the first photovoltaic device portion 310 and the second photovoltaic device portion 320 are arranged such that the face 316 of the first perovskite material layer 311 is in contact with the face 326 of the second perovskite material layer 321. Next, the first photovoltaic device portion 310 and second photovoltaic device portion 320 are compressed and heated to a pressure and temperature sufficient to fuse the first perovskite material layer 311 to the second perovskite material layer 321. The resulting photovoltaic device 330 has a single perovskite material layer 331.

In some embodiments, photovoltaic device portion 310 may include a substrate 312, electrode layer 313, and one or more interfacial layers 314 in addition to the perovskite material layer 311. In some embodiments, photovoltaic device portion 320 may include a substrate 322, electrode layer 323, and one or more interfacial layers 324 in addition to the perovskite material layer 321. Each of the one or more interfacial layers 314 and 324 may include any material described herein as an interfacial layer. Each of the electrode layers 312 and 322 may include any electrode material described herein, including, for example, indium tin oxide (ITO) and fluorine doped tin oxide (FTO).

Photovoltaic device portion 310, in some embodiments, may be constructed by depositing an electrode layer 313 onto a substrate 312, then depositing one or more interfacial layers 314 onto electrode layer 313, and finally depositing a perovskite material layer 311 onto the one or more interfacial layers 314. Photovoltaic device portion 320, in some embodiments, may be constructed by depositing an electrode layer 323 onto a substrate 322, then depositing one or more interfacial layers 324 onto electrode layer 323, and finally depositing a perovskite material layer 321 onto the one or more interfacial layers 324. Any process for depositing a thin film layer described herein may be used to deposit the electrode layers 313 and 323, interfacial layers 314 and 324, and perovskite material layers 311 and 321.

Perovskite material layers 311 and 321 may be a perovskite material described herein. In some embodiments, perovskite material layers 311 and 321 may be the same perovskite material. For example, perovskite material layers 311 and 321 may both include a formamidinium lead iodide (FAPbI$_3$) perovskite material. In other embodiments, perovskite material layers 311 and 321 may each include a different perovskite material than the other. For example, perovskite material layer 311 may comprise a perovskite material having the formula FAPbI$_3$ and perovskite material layer 321 may comprise a perovskite material having the formula MAPbI$_3$. In another embodiment, perovskite material layer 311 may comprise a perovskite material having the formula CsPbI$_3$ and perovskite material layer 321 may comprise a perovskite material having the formula FAPbI$_3$. In yet another embodiment, perovskite material layer 311 may comprise a perovskite material having the formula FASnI$_3$ and perovskite material layer 321 may comprise a perovskite material having the formula FAPbI$_3$. Using different perovskite materials for perovskite material layers 311 and 321 may result in a perovskite material layer 331 having a gradient of optical absorption characteristics, absorbing certain wavelengths at some depths and different wave lengths at greater depths. Such a gradient may result in enhanced efficiency for photovoltaic device 330 through implementation of a perovskite material layer 331 with a broader absorption spectrum than could be achieved using a single perovskite material.

The pressure applied to photovoltaic device portions 310 and 320 may range between 0.1 and 30 MPa and may be applied for between 1 second and 100 minutes. In certain embodiments, the pressure applied to photovoltaic device portions 310 and 320 may range from 1 to 7 MPa and may be applied for 5 to 45 minutes. Pressure may be applied to photovoltaic device portions 310 and 320 by any means capable of applying a compressive force to photovoltaic device portions 310 and 320. For example, hydraulic presses, pneumatic presses, screw driven mechanical presses or clamps, gear driven mechanical presses or clamps, or weights, may be used to apply pressure to photovoltaic device portions 310 and 320.

While pressure is applied to photovoltaic device portions 310 and 320, photovoltaic device portions 310 and 320 may be head to and held at an elevated temperature. In some embodiments, the temperature of photovoltaic device portions 310 and 320 may be increased prior to the application of pressure. In other embodiments, the temperature of photovoltaic device portions 310 and 320 may be increased during the application of pressure. The temperature of photovoltaic device portions 310 and 320 may be increased to a temperature between 20° and 500° Celsius prior to or during the application of pressure to photovoltaic device portions 310 and 320. In particular embodiments, the temperature of photovoltaic device portions 310 and 320 may be increased to a temperature between 75° and 177° Celsius prior to or during the application of pressure to photovoltaic device portions 310 and 320.

Assembling a photovoltaic device as illustrated by FIG. 5 provides several advantages to prior "bottom-up" methods of assembly for thin film devices, wherein each subsequent layer was deposited on top of the preceding layers. One advantage of the method illustrated in FIG. 5 is that it enables construction of a photovoltaic device with interfacial layers above and below the perovskite material layer 331 that may require deposition methods that would be detrimental to perovskite layer 331. Previously, after a perovskite material layer was deposited onto such an interfacial layer, another such interfacial layer could not be deposited on top of the perovskite material layer without degrading the perovskite material layer. This resulted in compromises in choice of interfacial layers, which could lead to sub-optimal photovoltaic device performance. The method illustrated by FIG. 5, and the variations on that method described herein with respect to FIGS. 6-10, allow for assembly of a photovoltaic device without the need to deposit an interfacial layer on top of a perovskite material layer, thereby enabling optimized selection of interfacial layers. For example, many interfacial layers are preferably deposited using techniques such as sputtering or electron beam deposition and are annealed at temperatures greater than 150° C., which may damage the perovskite material layer. By enabling construction of photovoltaic devices with interfacial layers that are deposited before the perovskite material layer, the method illustrated by FIG. 5 allowed for deposition of interfacial layers by the preferred methods. Additionally, the techniques described herein enable construction of a photovoltaic device without use of an encapsulation layer between the electrode layer and the "top" substrate, because each electrode layer is deposited directly onto the substrate prior to assembly of the photovoltaic device.

Figure 6:
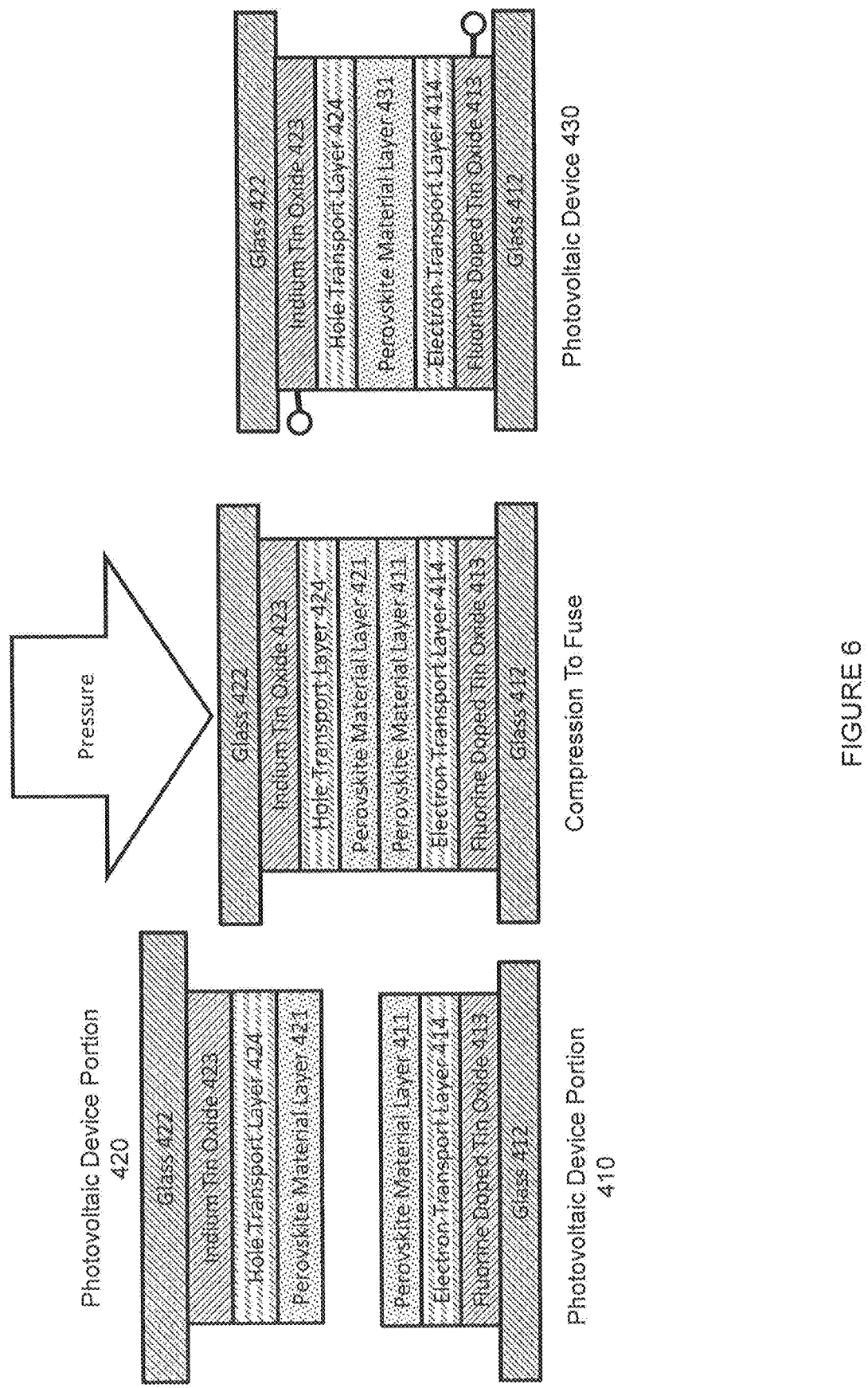
FIG. 6 is a stylized diagram showing a method for assembly of an example device according to some embodiments of the present disclosure.

FIG. 6 illustrates a particular embodiment of the method for assembling a photovoltaic device as described with respect to FIG. 5. In the embodiment illustrated in FIG. 6, photovoltaic device portion 410 includes a glass layer 412, fluorine doped tine oxide layer 413, electron transport layer 414, and perovskite material layer 411. Photovoltaic device portion 420, in the embodiment illustrated in FIG. 6, includes a glass layer 422, indium tin oxide layer 423, hole transport layer 424, and perovskite material layer 421.

Figure 7:
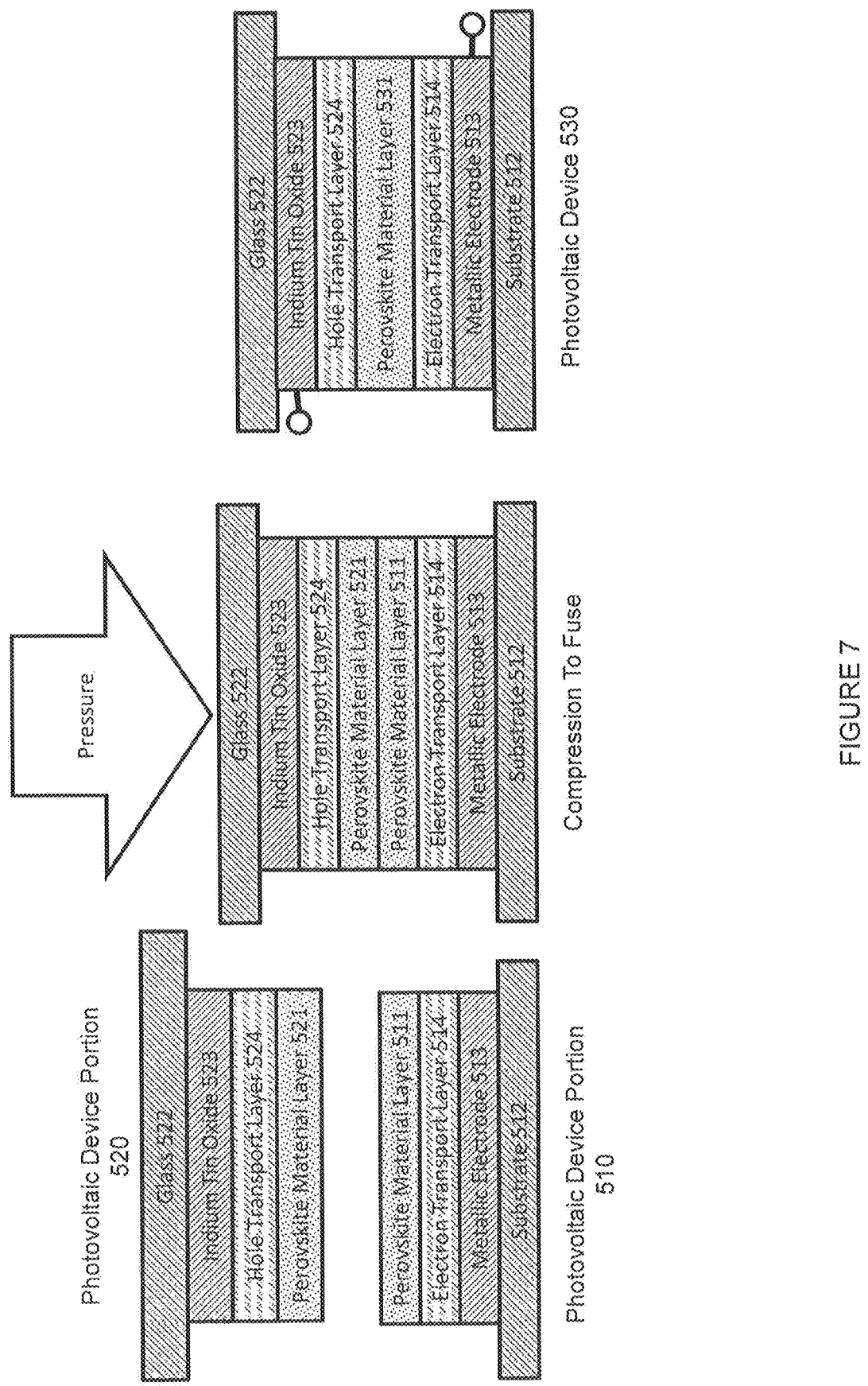
FIG. 7 is a stylized diagram showing a method for assembly an example device according to some embodiments of the present disclosure.

FIG. 7 illustrates a particular embodiment of the method for assembling a photovoltaic device as described with respect to FIG. 5. In the embodiment illustrated in FIG. 7, photovoltaic device portion 510 includes a substrate layer 512, metallic electrode layer 513, electron transport layer 514, and perovskite material layer 511. In some embodiments, for example, in high-power applications such as power plants, substrate layer 512 may be non-transparent. In other embodiments, for example in lower-power applications such as solar windows, substrate layer 512 may be transparent or translucent. Photovoltaic device portion 520, in the embodiment illustrated in FIG. 7, includes a glass layer 522, indium tin oxide layer 523, hole transport layer 524, and perovskite material layer 521.

Figure 8:
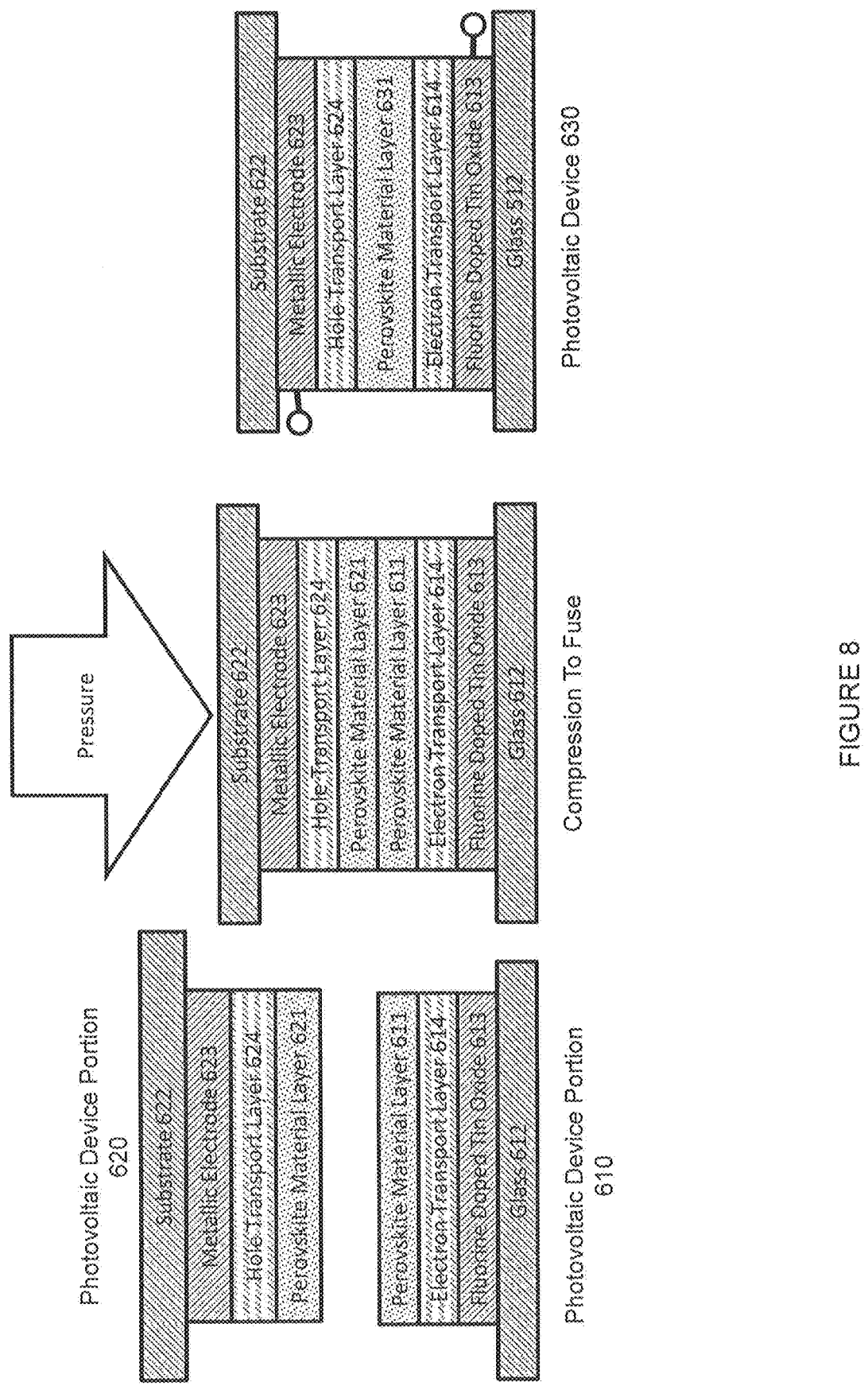
FIG. 8 is a stylized diagram showing a method for assembly an example device according to some embodiments of the present disclosure.

FIG. 8 illustrates a particular embodiment of the method for assembling a photovoltaic device as described with respect to FIG. 5. In the embodiment illustrated in FIG. 8, photovoltaic device portion 610 includes a glass layer 612, fluorine doped tine oxide layer 613, electron transport layer 614, and perovskite material layer 611. Photovoltaic device portion 620, in the embodiment illustrated in FIG. 8, includes a substrate layer 622, metallic electrode layer 623, hole transport layer 624, and perovskite material layer 621. In some embodiments, for example, in high-power applications such as power plants, substrate layer 622 may be non-transparent. In other embodiments, for example in lower-power applications such as solar windows, substrate layer 622 may be transparent or translucent.

Figure 9:
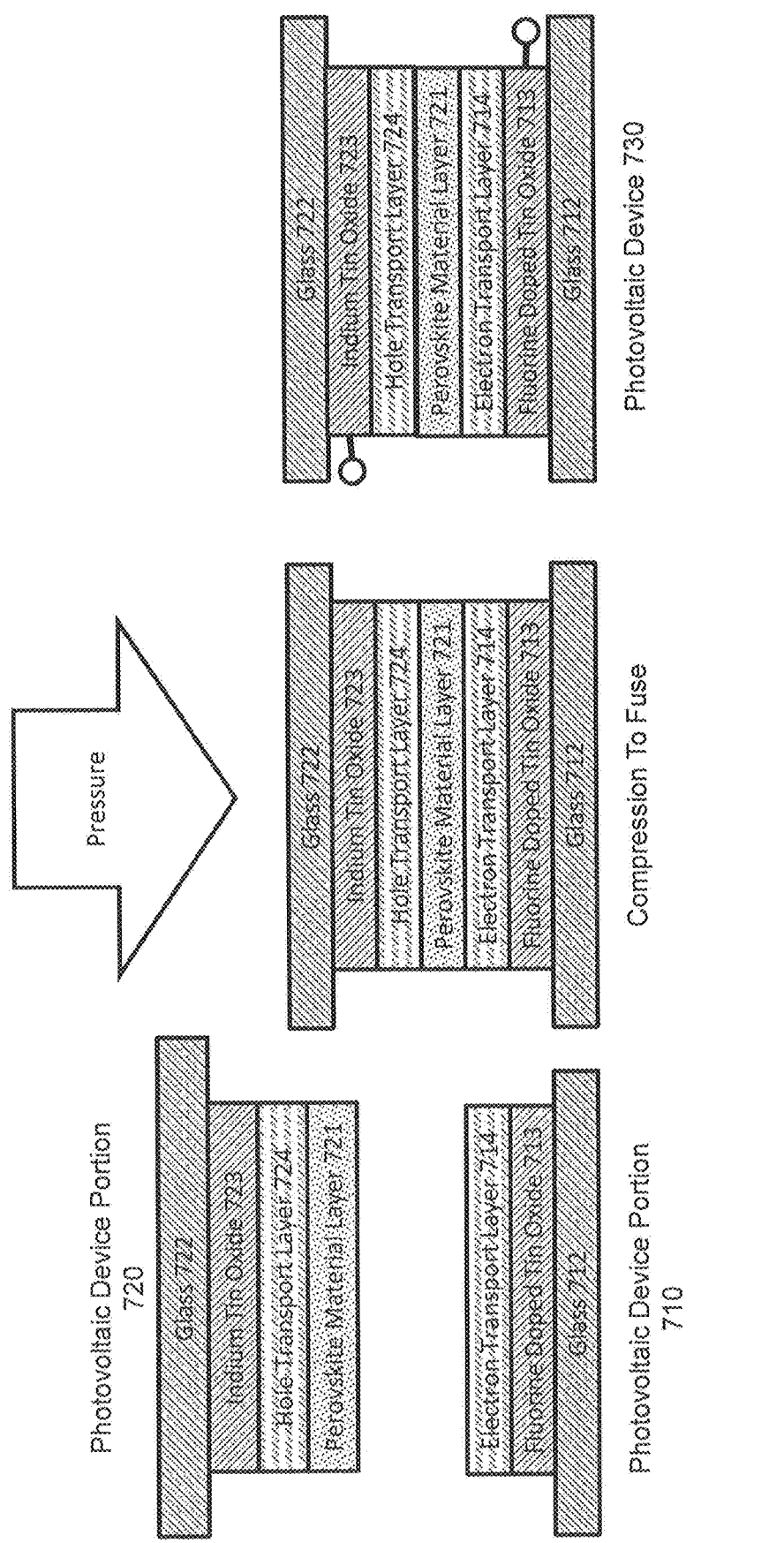
FIG. 9 is a stylized diagram showing a method for assembly an example device according to some embodiments of the present disclosure.

FIG. 9 illustrates a particular embodiment of the method for assembling a photovoltaic device as described with respect to FIG. 5. In the embodiment illustrated in FIG. 9, photovoltaic device portion 710 includes a glass layer 712, fluorine doped tine oxide layer 713, and electron transport layer 714. Photovoltaic device portion 720, in the embodiment illustrated in FIG. 9, includes a glass layer 722, indium tin oxide layer 723, hole transport layer 724, and perovskite material layer 721. In the embodiment illustrated in FIG. 9, only as single perovskite material layer 721 is present in photovoltaic device portion 720, and no perovskite material layer is present in photovoltaic device portion 710. When the photovoltaic device portions are compressed and annealed, perovskite material layer 721 fuses to electron transport layer 714, resulting in photovoltaic device 730.

Figure 10:
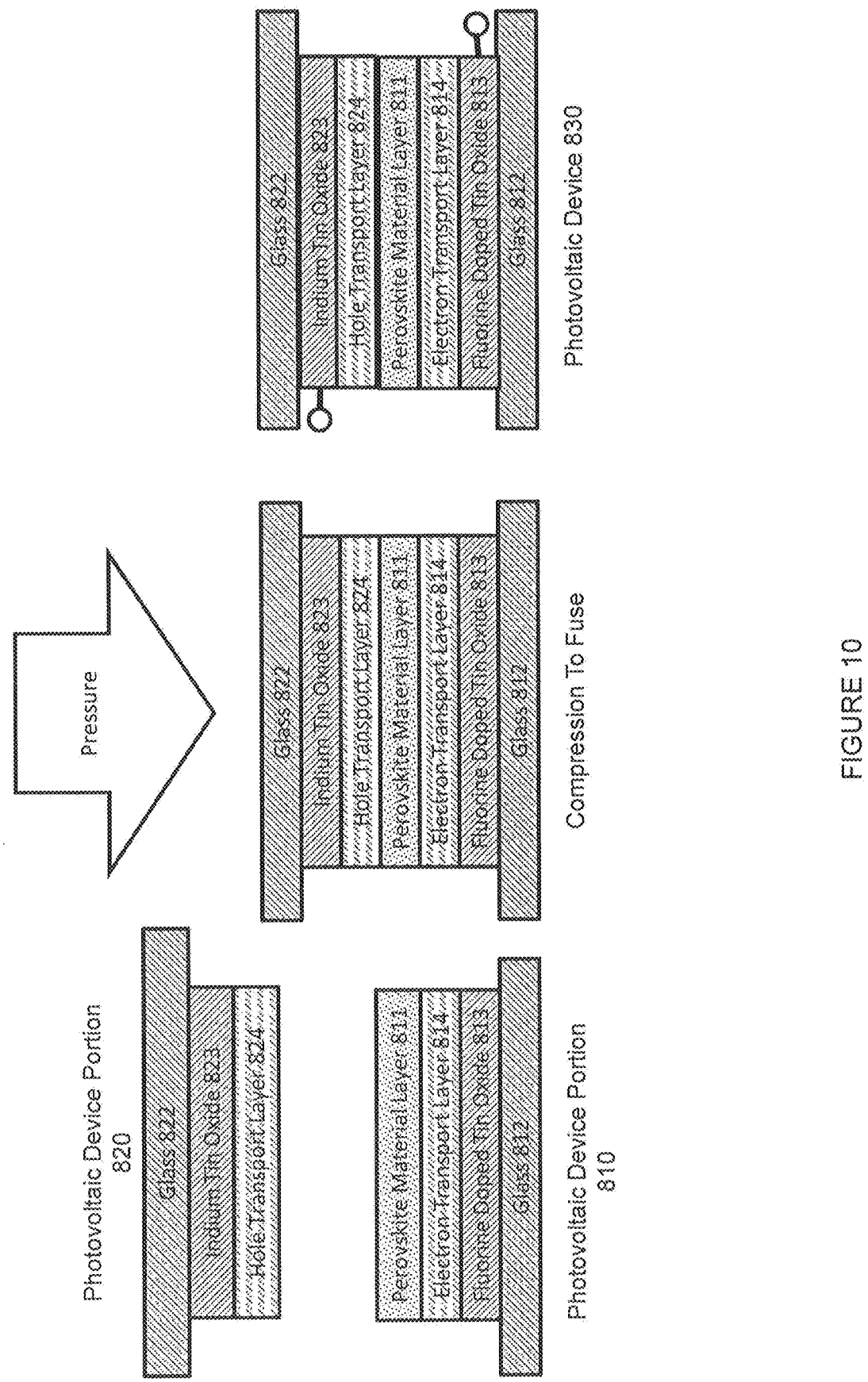
FIG. 10 is a stylized diagram showing a method for assembly an example device according to some embodiments of the present disclosure.

FIG. 10 illustrates a particular embodiment of the method for assembling a photovoltaic device as described with respect to FIG. 5. In the embodiment illustrated in FIG. 10, photovoltaic device portion 810 includes a glass layer 812, fluorine doped tine oxide layer 813, and electron transport layer 814, perovskite material layer 811. Photovoltaic device portion 820, in the embodiment illustrated in FIG. 10, includes a glass layer 822, indium tin oxide layer 823, and hole transport layer 824. In the embodiment illustrated in FIG. 10, only as single perovskite material layer 811 is present in photovoltaic device portion 810, and no perovskite material layer is present in photovoltaic device portion 720. When the photovoltaic device portions are compressed and annealed, perovskite material layer 811 fuses to hole transport layer 824, resulting in photovoltaic device 830.

Figure 11:
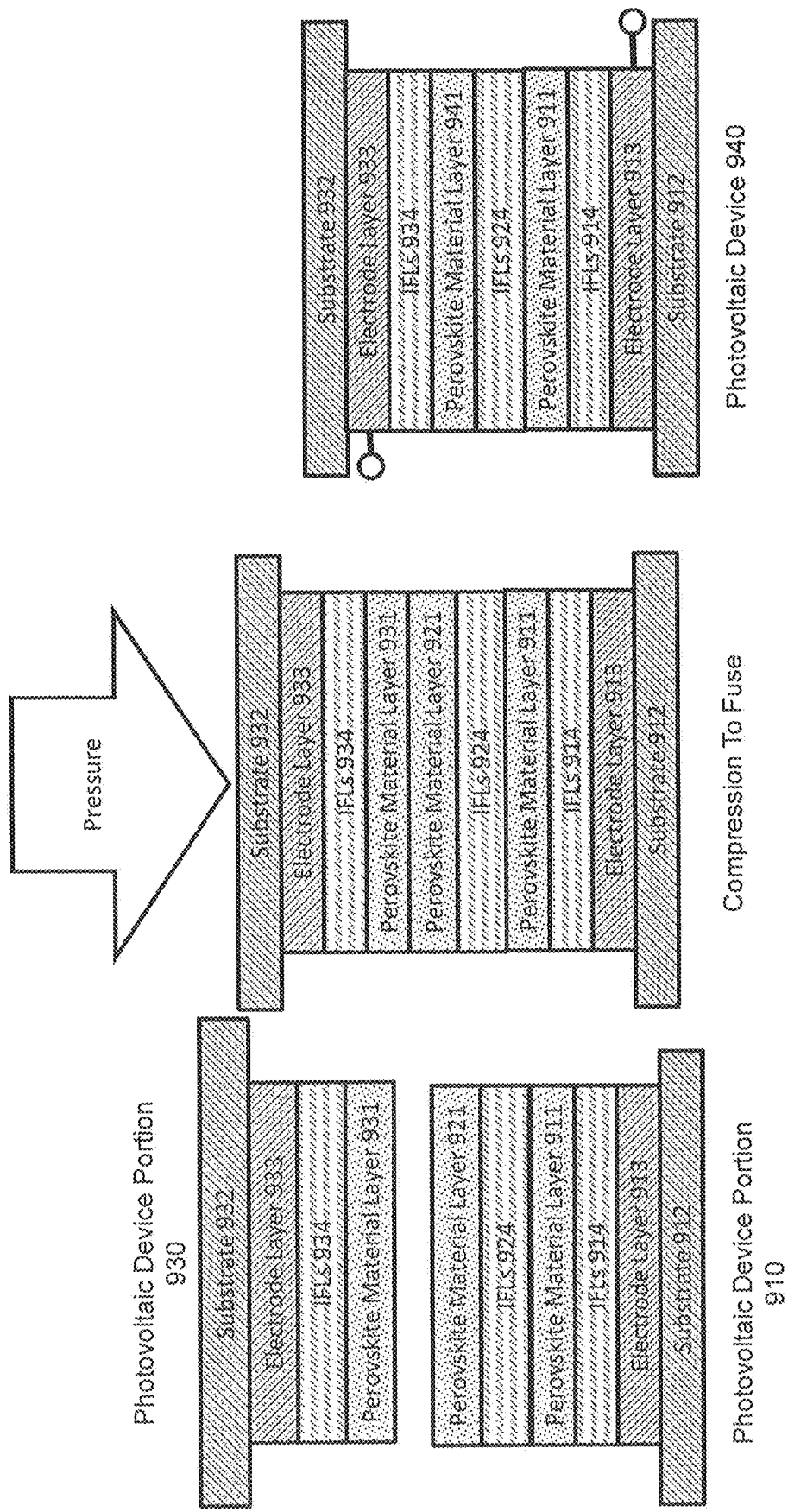
FIG. 11 is a stylized diagram showing a method for assembly an example device according to some embodiments of the present disclosure.

FIG. 11 illustrates a particular embodiment of the method for assembling a photovoltaic device as described with respect to FIG. 5. The embodiment illustrated in FIG. 11, shows a method for assembling a tandem photovoltaic device that has two perovskite material layers and one or more interfacial layers between the perovskite material layers. These one or more interfacial layers between the perovskite material layers may be referred to as a recombination layer. In the embodiment illustrated in FIG. 11, photovoltaic device portion 910 includes a substrate layer 912, electrode layer 913, one or more interfacial layers 914, perovskite material layer 911, one or more interfacial layers 924, and a perovskite material layer 921. Photovoltaic device portion 930, in the embodiment illustrated in FIG. 11, includes a substrate layer 932, electrode layer 933, one or more interfacial layers 934, and perovskite material layer 931. When the photovoltaic device portions are compressed and annealed, perovskite material layer 931 fuses to perovskite layer 921 to form a fused perovskite material layer 941, resulting in photovoltaic device 940. In some embodiments, various layers may be omitted. For example, perovskite material 921 may be omitted and perovskite material 931 may be fused directly to IFLs 924. In certain embodiments, photovoltaic device portion 910 may be assembled in a manner similar to that illustrated in FIG. 5, and then additional IFLs 924 and perovskite material layer 921 may be deposited onto the PV prior to fusing with photovoltaic device portion 930. In such an embodiment, a substrate such as substrate 322 of FIG. 5, may be removed from the PV cell portion prior to deposition of subsequent layers.

Figure 13:
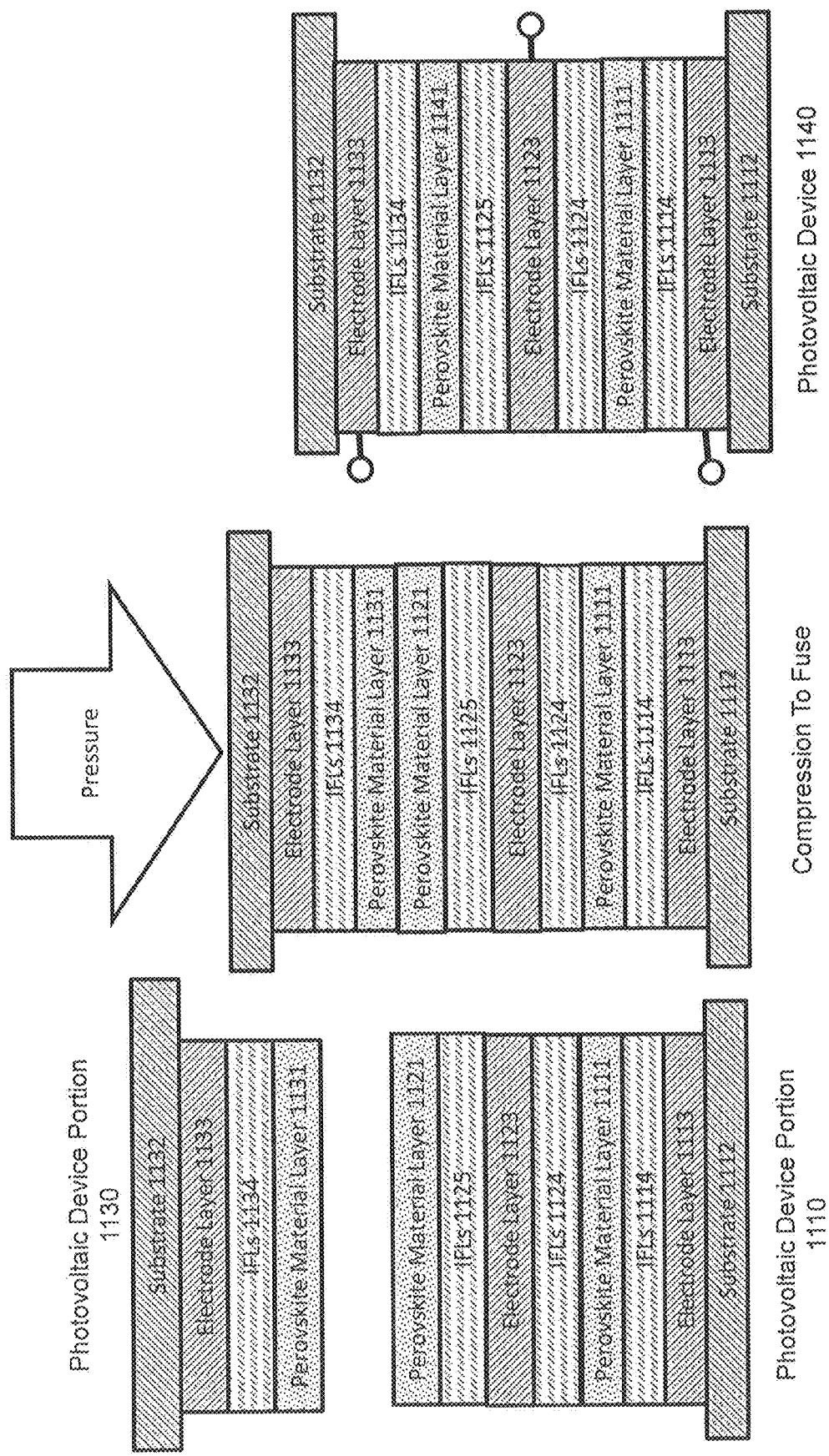
FIG. 13 is a stylized diagram showing a method for assembly an example device according to some embodiments of the present disclosure.

Tandem devices including 2-terminal, 3-terminal, and 4-terminal cells discussed herein may be assembled by the methods described with respect to FIGS. 5-11. For example, FIG. 11 presents a stylized illustration of an example method for assembling a 2-terminal PV cell according to the present disclosure. FIG. 13 presents a stylized illustration of an example method for assembling a 3-terminal PV cell, such as PV cell 7000 illustrated in FIG. 17, according to the present disclosure. And, FIG. 14 presents a stylized illustration of an example method for assembling a 4-terminal PV cell, such as PV cell 8000 illustrated in FIG. 18, according to the present disclosure.

In the embodiment illustrated in FIG. 13, photovoltaic device portion 1110 includes a substrate layer 1112, electrode layer 1113, one or more interfacial layers 1114, perovskite material layer 1111, one or more interfacial layers 1124, electrode layer 1123, one or more interfacial layers 1125, and perovskite material layer 1121. Photovoltaic device portion 1130, in the embodiment illustrated in FIG. 13, includes a substrate layer 1132, electrode layer 1133, one or more interfacial layers 1134, and perovskite material layer 1131. When the photovoltaic device portions are compressed and annealed, perovskite material layer 1131 fuses to perovskite layer 1121 to form a fused perovskite material layer 1141, resulting in photovoltaic device 1140. It should be understood from the present disclosure that any layer illustrated as being included in photovoltaic device portion 1120 could be included in photovoltaic device portion 1110 prior to compression. For example, in some embodiments, photovoltaic device portion 1110 may include electrode layer 1126 and one or more interfacial layers 1125. In such an embodiment, interfacial layer 1125 would fuse to perovskite layer 1121 during compression. In some embodiments, various layers may be omitted. For example, perovskite material 1121 may be omitted and perovskite material 1131 may be fused directly to IFLs 1125. In certain embodiments, photovoltaic device portions 1110 or 1130 may be assembled in a manner similar to that illustrated in FIG. 5.

Figure 14:
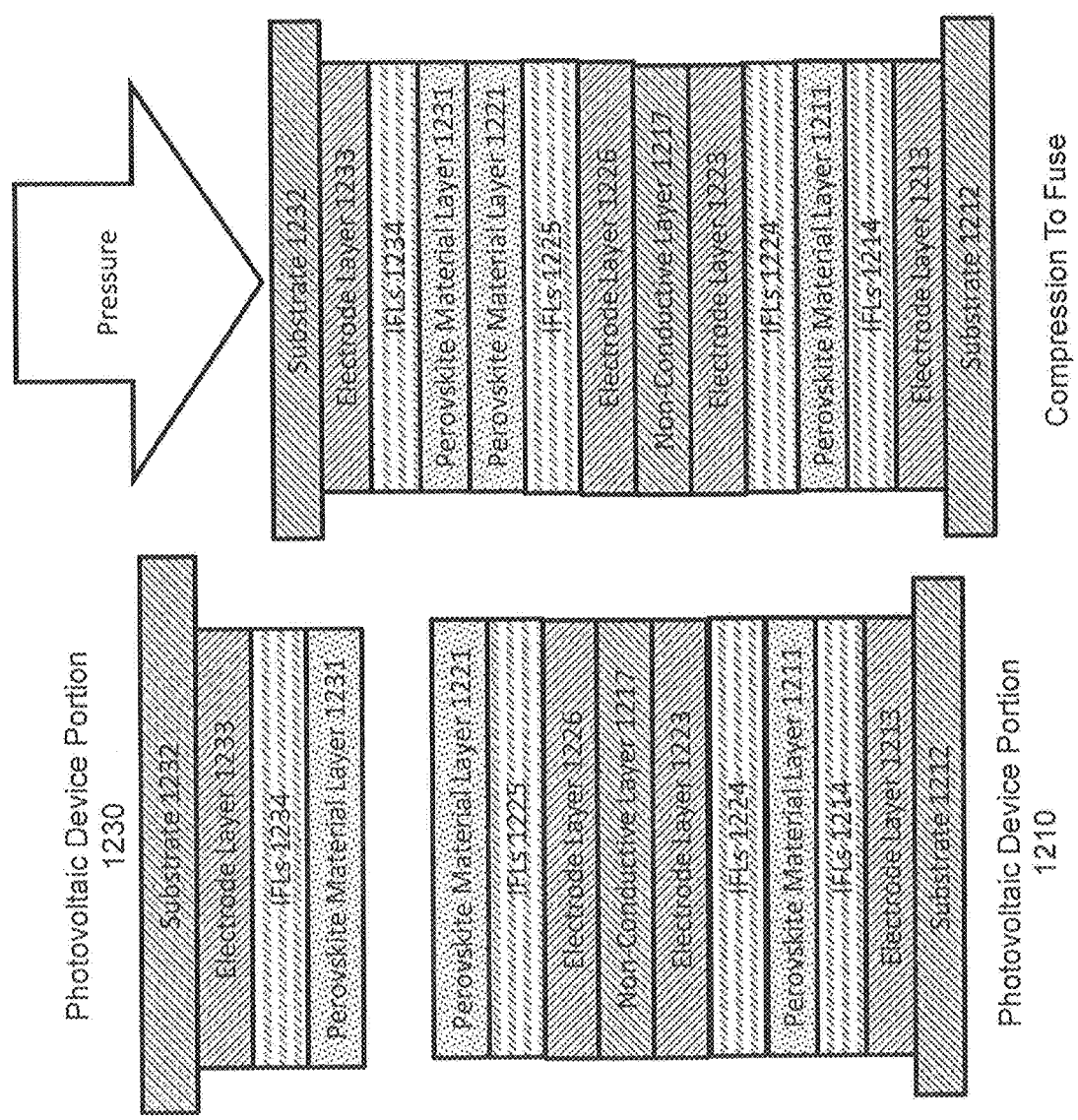
FIG. 14 is a stylized diagram showing a method for assembly an example device according to some embodiments of the present disclosure.
Figure 14:
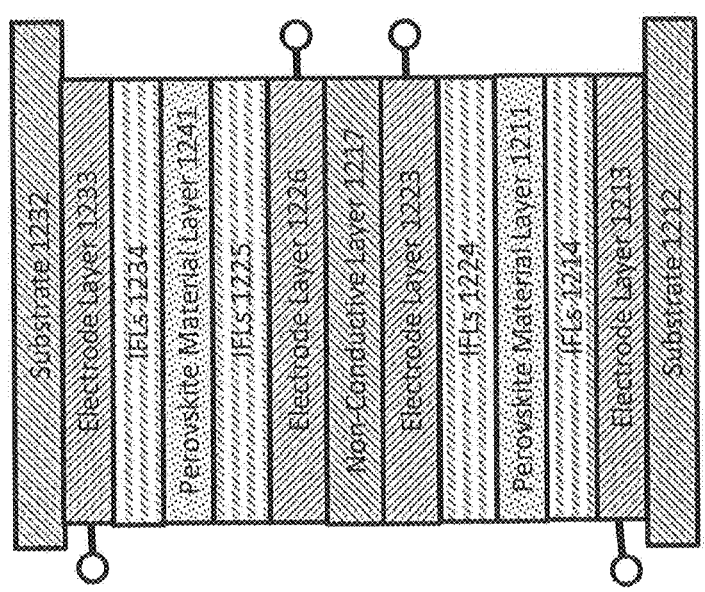

In the embodiment illustrated in FIG. 14, photovoltaic device portion 1210 includes a substrate layer 1212, electrode layer 1213, one or more interfacial layers 1214, perovskite material layer 1211, one or more interfacial layers 1224, electrode layer 1223, transparent non-conductive layer 1217, electrode layer 1226, one or more interfacial layers 1225, and perovskite material layer 1121. Photovoltaic device portion 1230, in the embodiment illustrated in FIG. 14, includes a substrate layer 1232, electrode layer 1233, one or more interfacial layers 1234, and perovskite material layer 1231. When the photovoltaic device portions are compressed and annealed, perovskite material layer 1231 fuses to perovskite layer 1221 to form a fused perovskite material layer 1241, resulting in photovoltaic device 1240. It should be understood from the present disclosure that any layer illustrated as being included in photovoltaic device portion 1210 could be included in photovoltaic device portion 1220 prior to compression and vise-versa. For example, in some embodiments, photovoltaic device portion 1230 may omit perovskite material layer 1221, and include one or more interfacial layers 1225, electrode layer 1226 and a second transparent non-conductive layer. In such an embodiment, transparent non-conductive layer 1217 would fuse to the second transparent non-conductive material during compression. In some embodiments, photovoltaic device portions 1210 or 1230 may be assembled in a manner similar to that illustrated in FIG. 5.

Figure 12:
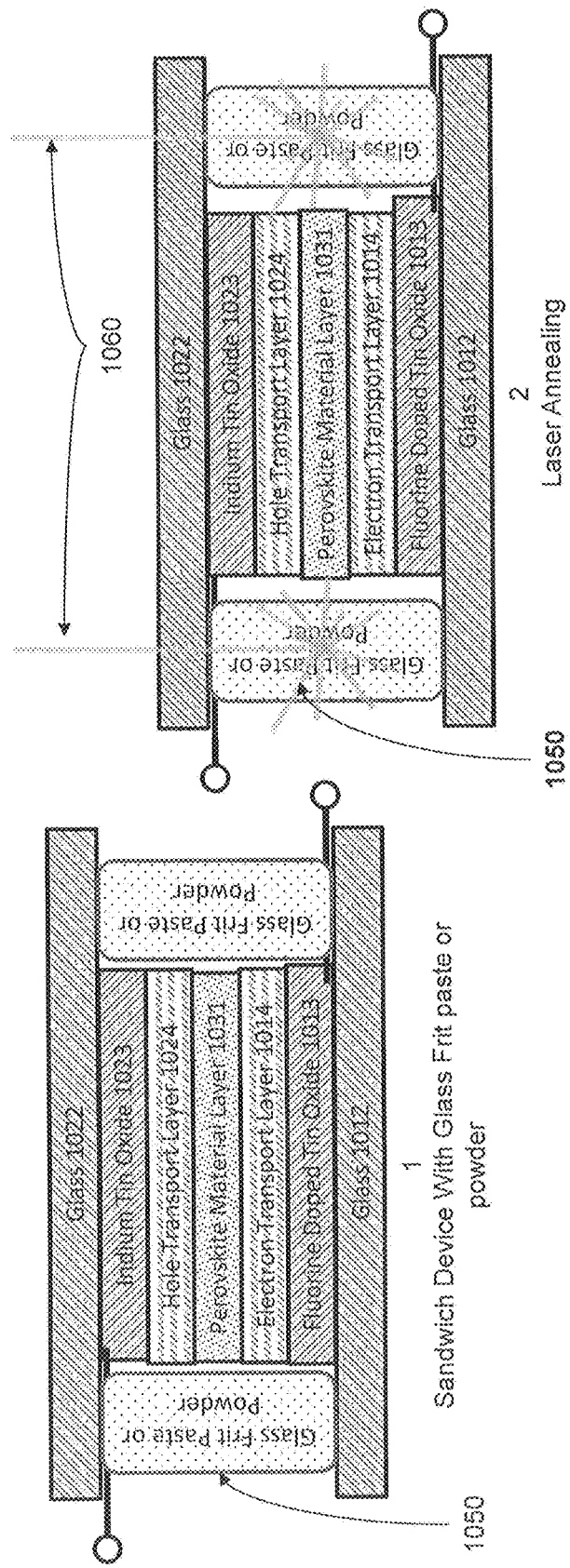
FIG. 12 is a stylized diagram showing a method for sealing an example device according to some embodiments of the present disclosure.
Figure 12:
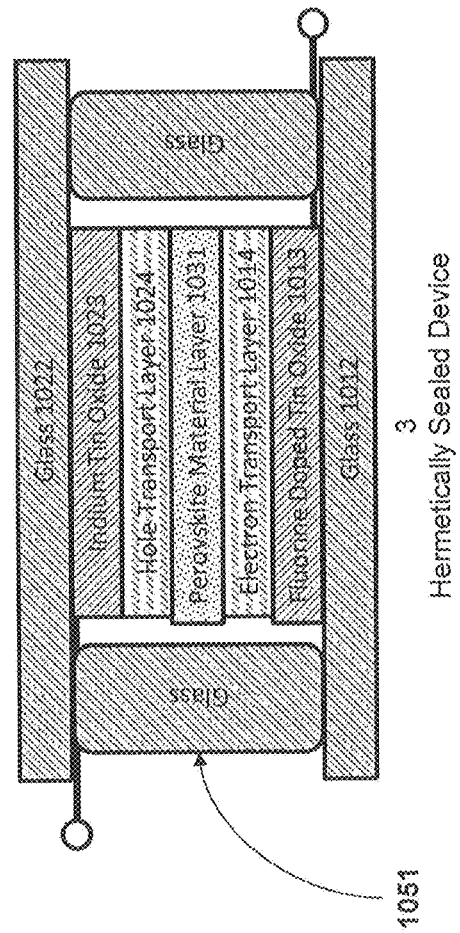

In some embodiments, a photovoltaic device assembled as illustrated in FIGS. 5-11, 13, and 14 may be sealed as illustrated in FIG. 12. First a glass frit paste, ink, solution, or powder 1050 is placed between glass substrates 1012 and 1022 and around layers 1013, 1014, 1031, 1024, and 1023. In some embodiments, the glass frit may be placed onto the substrates of one or both photovoltaic device portions as illustrated in FIGS. 5-11 prior to compression of the two photovoltaic device portions. Next, the glass frit 1050 is heated by a localized heating process such as laser annealing by laser beams 1060, stir welding, or through compression as described above. Finally, the heated glass frit solidifies to a solid glass 1051 that has bonded to glass substrates 1012 and 1022, thereby sealing layers 1013, 1014, 1031, 1024, and 1023 in the interior of the device between glass substrates 1012 and 1022 and solidified glass 1051.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, and set forth every range encompassed within the broader range of values. Also, the terms in the claims have their plain, ordinary meaning unless otherwise explicitly and clearly defined by the patentee.

The invention claimed is:

1. A method for manufacturing a photovoltaic device comprising:
fabricating a first photovoltaic device portion with a first perovskite material layer having a first face;
fabricating a second photovoltaic device portion with a second perovskite material layer having a second face, wherein the second photovoltaic device portion has a third perovskite material layer, and wherein the first perovskite material layer and the second perovskite material layer have a different chemical formula or composition;
placing a glass frit paste, ink, solution, or powder around a perimeter of the first photovoltaic device portion;
arranging the first photovoltaic device portion and the second photovoltaic device portion such that the first face is in contact with the second face;
compressing the first photovoltaic device portion and second photovoltaic device portion at a pressure sufficient to fuse the first perovskite material to the second perovskite material.

2. The method of claim 1, further comprising sealing the photovoltaic device.

3. The method of claim 1, wherein the first photovoltaic device portion further comprises:
a first substrate;
a first electrode layer deposited onto the first substrate;
a first interfacial layer deposited between the first electrode layer and the first perovskite material layer; and
wherein the second photovoltaic device portion further comprises:
a second substrate;
a second electrode layer deposited onto the second substrate;
a second interfacial layer deposited between the second electrode layer and the third perovskite material layer;
a third interfacial layer deposited between the third perovskite material layer and the second perovskite material layer.

4. The method of claim 1, wherein the first perovskite material layer and second perovskite material layer comprise a formamidinium lead iodide perovskite material.

5. The method of claim 1, wherein the first perovskite material layer comprises a perovskite material having the formula $FAPbI_3$ and the second perovskite material layer comprises a perovskite having the formula $MAPbI_3$.

6. The method of claim 1, wherein the first perovskite material layer comprises a perovskite material having the formula $CsPbI_3$ and the second perovskite material layer comprises a perovskite having the formula $FAPbI_3$.

7. The method of claim 1, wherein the first perovskite material layer comprises a perovskite material having the formula $FASnI_3$ and the second perovskite material layer comprises a perovskite having the formula $FAPbI_3$.

8. The method of claim 1, wherein the pressure sufficient to fuse the first perovskite material to the second perovskite material is between 1 and 7 MPa.

9. The method of claim 1, further comprising heating the first photovoltaic device portion and second photovoltaic device portion to a temperature between 75° C. and 177° C. while first photovoltaic device portion and second photovoltaic device portion are being compressed.

10. The method of claim 1, further comprising heating the first photovoltaic device portion and second photovoltaic device portion to a temperature between 75° C. and 177° C. while first photovoltaic device portion and second photovoltaic device portion are being compressed, and wherein the pressure sufficient to fuse the first perovskite material to the second perovskite material is between 1 and 7 MPa.

11. A method for manufacturing an electronic device comprising:
depositing a first electrode layer onto a first substrate;
depositing one or more first interfacial layers onto the first electrode layer;
depositing a first perovskite material layer onto the one or more first interfacial layers;
depositing a second electrode layer onto a second substrate;
depositing one or more second interfacial layers onto the second electrode layer;
depositing a second perovskite material layer onto the one or more second interfacial layers;
depositing one or more third interfacial layers onto the second perovskite material layer;
depositing a third perovskite material layer onto the one or more third interfacial layers, wherein the first perovskite material layer and the third perovskite material layer have a different chemical formula or composition;
depositing a glass frit paste, ink, solution, or powder around a perimeter of the first substrate;
orienting the second substrate such that the third perovskite material layer is in contact with the first perovskite material layer;
applying a sufficient pressure to the second substrate to fuse the third perovskite material layer with the first perovskite material layer.

12. The method of claim 11, wherein the first perovskite material layer and second perovskite material layer comprise a formamidinium lead iodide perovskite material.

13. The method of claim 11, wherein the first perovskite material layer comprises a perovskite material having the formula $FAPbI_3$ and the third perovskite material layer comprises a perovskite having the formula $MAPbI_3$.

14. The method of claim 11, wherein the pressure sufficient to fuse the first perovskite material to the third perovskite material is between 1 and 7 MPa.

15. The method of claim 11, further comprising heating the first photovoltaic device and second photovoltaic device to a temperature between 75° C. and 177° C. while first photovoltaic device and second photovoltaic device are being compressed.

16. The method of claim 11, further comprising heating the first photovoltaic device and second photovoltaic device to a temperature between 75° C. and 177° C. while first photovoltaic device and second photovoltaic device are being compressed, and wherein the pressure sufficient to fuse the first perovskite material to the third perovskite material is between 1 and 7 MPa.

* * * * *